United States Patent [19]
Hu et al.

[11] Patent Number: 5,936,278
[45] Date of Patent: Aug. 10, 1999

[54] SEMICONDUCTOR ON SILICON (SOI) TRANSISTOR WITH A HALO IMPLANT

[75] Inventors: Yin Hu, Plano; Jarvis B. Jacobs, Dallas; Theodore W. Houston, Richardson, all of Tex.

[73] Assignee: Texas Instruments Incorporated, Dallas, Tex.

[21] Appl. No.: 08/813,524

[22] Filed: Mar. 7, 1997

Related U.S. Application Data

[60] Provisional application No. 60/013,364, Mar. 13, 1996.
[51] Int. Cl.$^6$ ............ H01L 27/01; H01L 27/12; H01L 31/0392
[52] U.S. Cl. ............ 257/336; 257/344; 257/347; 257/408
[58] Field of Search ............ 257/347, 408, 257/336, 344

[56] References Cited

U.S. PATENT DOCUMENTS

| | | | |
|---|---|---|---|
| 4,899,202 | 2/1990 | Blake et al. | 357/23.7 |
| 4,965,213 | 10/1990 | Blake | 437/21 |
| 5,160,989 | 11/1992 | Houston | 257/347 |
| 5,185,280 | 2/1993 | Houston et al. | 437/44 |
| 5,359,219 | 10/1994 | Hwang | 257/351 |
| 5,656,844 | 8/1997 | Klein et al. | 257/347 |

OTHER PUBLICATIONS

Kumamoto, et al., "An SOI Structure For Flash A/D Converter," IEEE Journal of Solid–State Circuits, vol. 23, No. 1, Feb. 1988, pp. 198–201.

*Primary Examiner*—William Mintel
*Attorney, Agent, or Firm*—Robby T. Holland; Carlton H. Hoel; Richard L. Donaldson

[57] ABSTRACT

A semiconductor over insulator transistor (100) includes a semiconductor mesa (36) formed over an insulating layer (34) which overlies a semiconductor substrate (32). Source and drain regions (66, 68) of a first conductivity type are formed at opposite ends of the mesa. A body node (56) of a second conductivity type is located between the source and drain regions in the mesa. A gate insulator (40) and a gate electrode (46) lie over the body node. Halo implants (54, 56) are placed to completely separate the source and drain regions from the body node, or channel regions, for improving short channel effect. The transistor is useful as a pass gate and as a peripheral transistor in a DRAM, and also is useful in digital and analog applications and in low power applications.

6 Claims, 23 Drawing Sheets

SEMICONDUCTOR ON SILICON (SOI) TRANSISTOR WITH A HALO IMPLANT

This is a Non Provisional application filed under 35 U.S.C. 119(e) and claims priority of prior provisional Ser. No. 60/013,364 of inventor Hu et al. filed Mar. 13, 1996.

FIELD OF THE INVENTION

This invention relates to semiconductor transistor devices and more particularly to semiconductor on silicon transistor devices.

BACKGROUND OF THE INVENTION

Semiconductor on insulator (SOI) technology is becoming of increasing importance in the field in integrated circuits. SOI technology deals with the formation of transistors in a layer of semiconductor material which overlies an insulating layer on a substrate. A common embodiment of SOI structures is a single crystal layer of silicon which overlies a layer of silicon dioxide.

A prior art semiconductor over insulator ("SOI") transistor includes a semiconductor mesa overlying an insulating layer. The semiconductor mesa has a source region at one end and a drain region at the other end thereof. A body region, body node or channel is disposed between the source and drain regions. Both the source and drain regions are of the same conductivity type and are of opposite conductivity type to that of the body region. For example, the source and drain regions are of an n-type material while body region is of a p-type material. It is to be understood that these types of materials may be reversed such that the source and drain regions are of a p-type material while the body node is of an n-type material. The source and drain regions are of a relatively high dopant concentration level, while the body region is of a relatively low dopant concentration level.

Semiconductor over insulator transistors can be used in many semiconductor device applications, for example, memory devices, microprocessors, controllers, and logic arrays. When the semiconductor over insulator transistors are considered for use in an application, the specific application may require different transistors. Some of the transistors may need long channels while others of the transistors need short channels. Also, there will be some variation of channel length due to process variations. It is important to have long and short channel transistors which have consistent threshold voltages with each other, as device dimensions decrease. It is also important to reduce the different effects of a floating body, in the long and short channel transistors, as much as possible when device dimensions decrease.

Prior art semiconductor on insulator transistors exhibit widely varying threshold voltage characteristics and floating gate effects between long and short channel devices. This is particularly true when the short channel length is reduced below approximately 0.3 $\mu$m.

SUMMARY OF THE INVENTION

These and other problems are resolved by a semiconductor on insulator transistor that includes a semiconductor mesa formed on a layer of insulator. Source and drain regions of a first conductivity type are formed in the semiconductor mesa. A body, or channel, region of a second conductivity type and of a first dopant level is located between the source and drain regions in the semiconductor mesa. Halo implant regions of the second conductivity type are placed between the source and drain regions, respectively, and the body region. The dopant level of the halo implant material is substantially equal to or greater than the first dopant level.

BRIEF DESCRIPTION OF THE DRAWINGS

A better understanding of the invention may be derived by reading the following detailed description with reference to the accompanying drawings wherein.

DETAILED DESCRIPTION

Figure 1A:
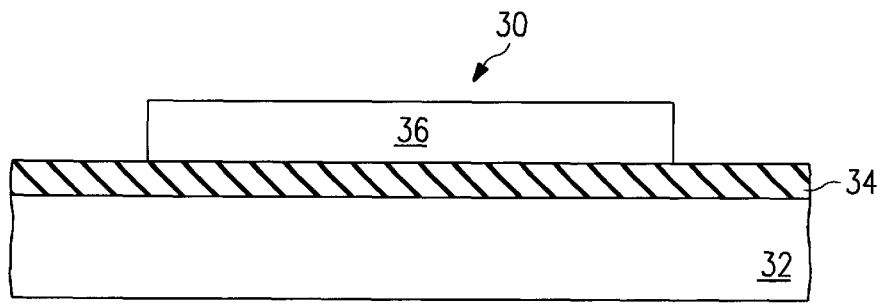
FIGS. 1a–1u show a series of cross-sections of an integrated circuit being fabricated into a semiconductor on insulator transistor.
Figure 1B:
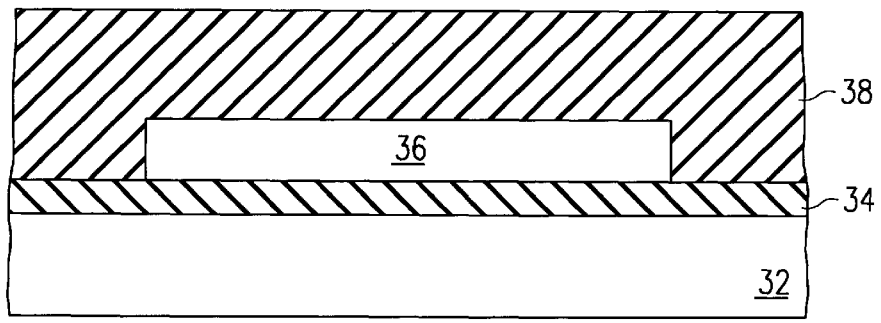

Referring now to FIG. 1a, there is shown a starting material 30 for fabricating a semiconductor on insulator transistor device. A semiconductor substrate 32 has a layer of insulator 34 laid over it. The substrate 32 may be silicon, for example. Also as an example, silicon dioxide or sapphire can be used for the insulator 34. Insulator 34 may comprise multiple dielectric layers. On top of the insulator 34, a layer of semiconductor, which may be silicon, is laid and formed into a mesa. The semiconductor mesa 36 is a single crystal. There are several known methods to fabricate the mesa semiconductor material 36 on the insulator 34. The subsequent FIGS. 1b–1u represent an exemplary process for fabricating a MOSFET transistor device. This exemplary process is presented as an example but it is not considered to be the only method of fabrication that can be used.

In FIG. 1b, there is shown the cross-section of the device following a step of growing or depositing an insulator 38 over all of the top of the device. The insulator 38 may be silicon dioxide.

Figure 1C:
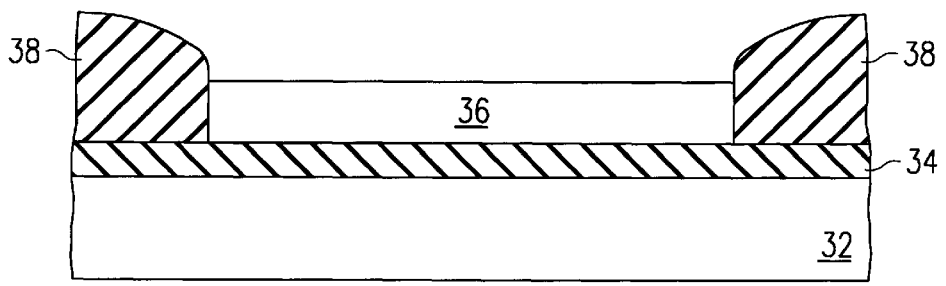

Subsequently, as shown in FIG. 1c, the insulator 38 is etched back over all to expose the top surface of the semiconductor mesa 36. The remaining insulator 38 and the layer 34 isolate the mesa of semiconductor 36 from other circuit elements to prevent cross-talk between the subject device and any other devices. There are other known methods for forming isolated regions of mesa, for example the use of LOCOS.

Figure 1D:
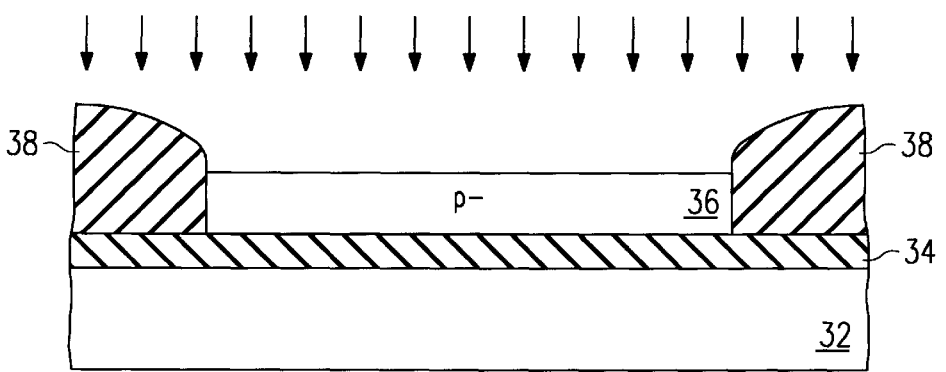

As shown in FIG. 1d the top of the device is exposed to an implant operation for establishing a level of dopant in the semiconductor mesa. In the present example, a p-type dopant is used to start creating an n-channel MOSFET transistor. Examples of a suitable p-type dopant material are boron, gallium, and indium. The amount of dopant is controlled so that a resulting dopant concentration in the channel region is relatively low. The low concentration level is represented by a designation p- and generally is in a range from $10^{14}/cm^3$ to $10^{18}/cm^3$. After the dopant level is established in the mesa 36, the top of the mesa is covered with an insulator.

Figure 1E:
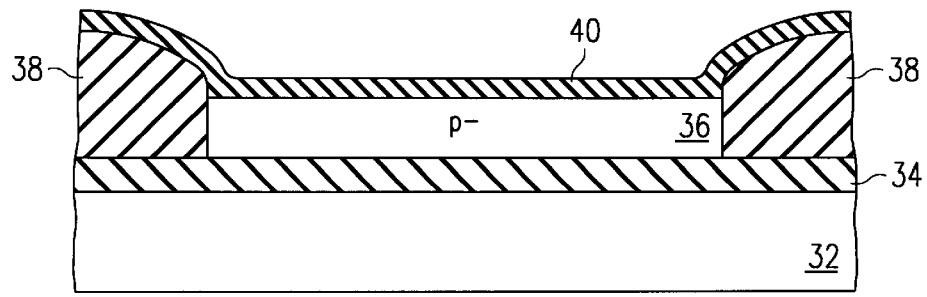

Referring now to FIG. 1e, there is shown a cross-section of the device after a layer of insulation 40 is formed over all. This layer of insulation 40 will function as a gate insulator. In subsequent figures, the part of the layer of insulation 40 which overlays the insulation regions 38 will be merged together as the region 38.

Figure 1F:
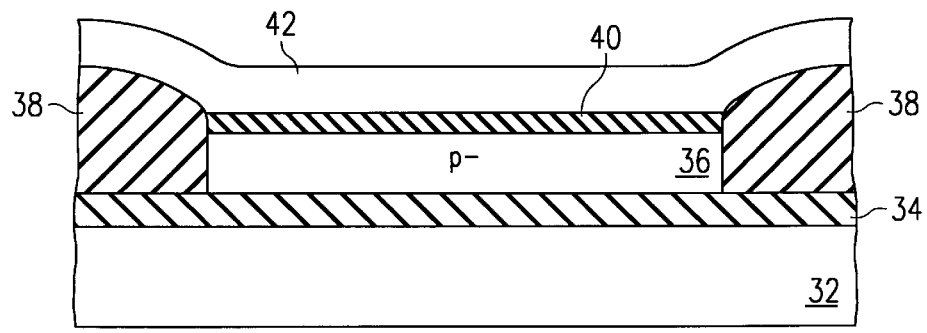

In FIG. 1f, there is shown the exemplary device after a layer of conductive material 42 is laid over all. This conductive material 42 is to be formed into a gate of the MOSFET transistor being fabricated.

Figure 1G:
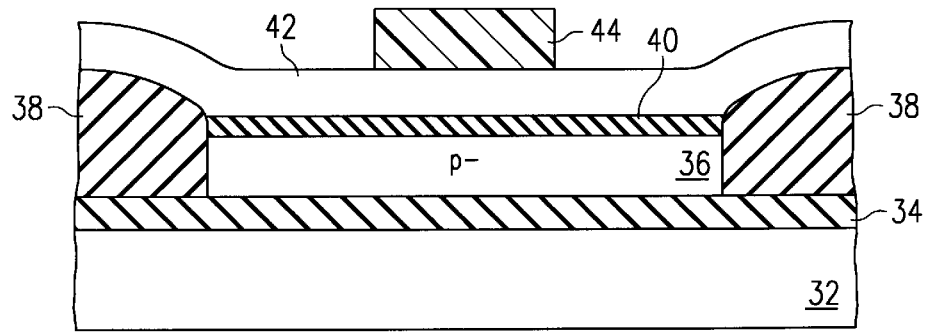

FIG. 1g shows the device after a photoresist material 44 is deposited over the top of the device and is patterned into a mask for forming the gate.

Figure 1H:
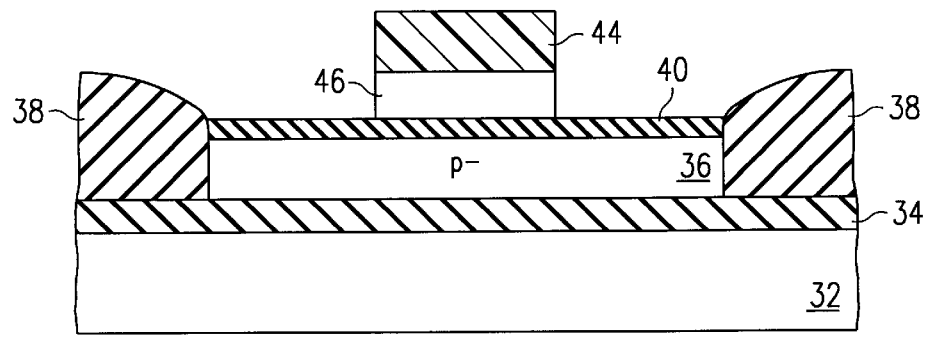

Referring now to FIG. 1h, there is shown the device after an etch of the layer of conductive material 42 leaving the conductive gate 46 of the MOSFET transistor being fabricated.

Figure 1I:
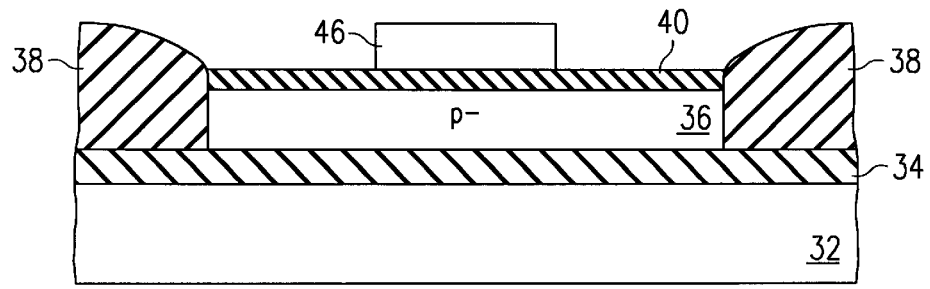

FIG. 1i shows the device following removal of the photoresist mask.

Figure 1J:
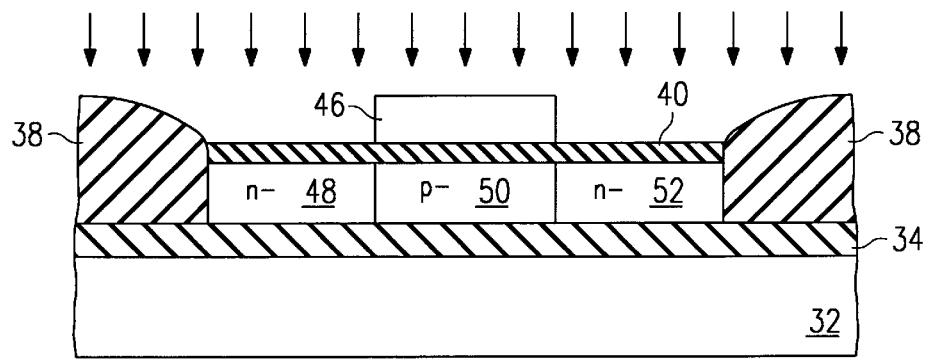

FIG. 1j illustrates a following an optional step for making a lightly doped drain (LDD) formation. The n-type dopant, for example, arsenic or phosphorous, is implanted through the insulator layer 40. A resulting low concentration level of the dopant is designated in FIG. 1j by the symbol n- and generally is in the range from $10^{14}/cm^3$ to $10^{19}/cm^3$. Thus the device being fabricated now has a source region 48, a channel region 50, and a drain region 52, all of them having low concentrations of their respective dopants.

Figure 1K:
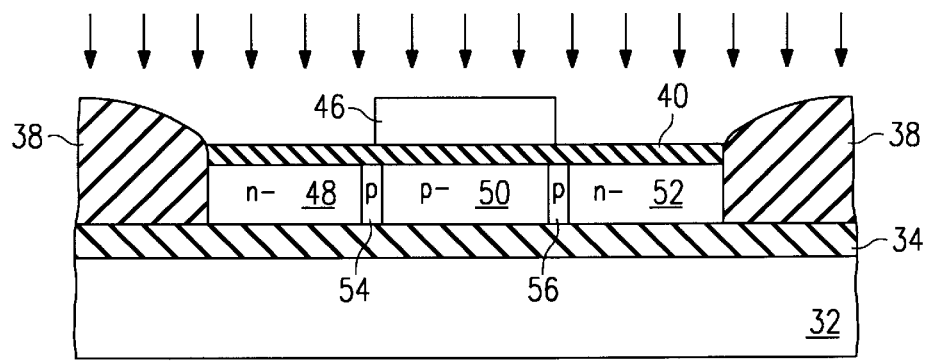

As shown in FIG. 1k, another implant follows. This implant is a halo implant. The dopant is a p-type dopant that is implanted to produce an intermediate concentration levels, designated by the symbol p. This intermediate concentration level is in a range from $10^{14}/cm^3$ to $10^{19}/cm^3$. The dopant material for the halo implant is selected to be more diffusive than the n-type dopant material residing in the source and drain regions 48 and 52. For example, the halo implant species may be boron with arsenic as the n-type dopant. Typically, bulk processes use some phosphorous in forming the n-type source and drain regions to reduce junction leakage. This is not a restriction for SOI devices. After the halo implant material is implanted into the source and drain regions 48 and 52, subsequent steps of fabrication, such as anneals, cause the halo dopant to diffuse toward the channel region 50. A typical anneal may be generally in the range of 700° C. to 1000° C. for a few seconds to a few hours. Thus the halo dopant forms the halo implant regions 54 and 56, shown in FIG. 1k. Alternative process sequence may be used to form the halo region including use of angled implant or use of gate side-wall spacer steps. For some of these sequences, the relative diffusity of the halo implant species and the source-drain implant species is not restricted. It is noted that the halo implant regions 54 and 56 completely separate the source and drain regions 48 and 52, respectively, from the channel region.

Figure 1L:
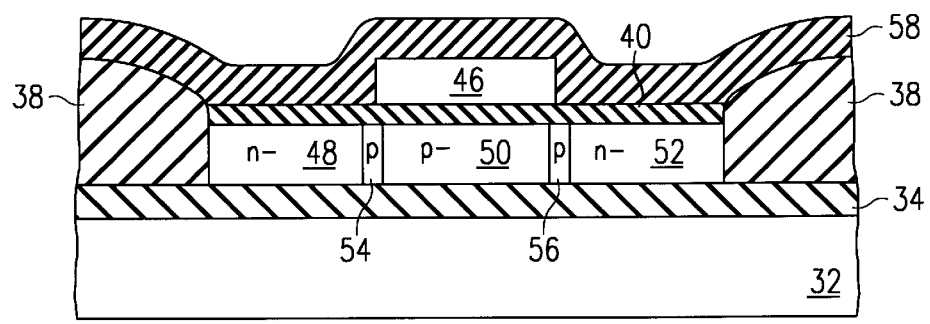

In FIG. 1l, a layer of insulation 58 such as an oxide or nitride for example is formed over the top of the device.

Figure 1M:
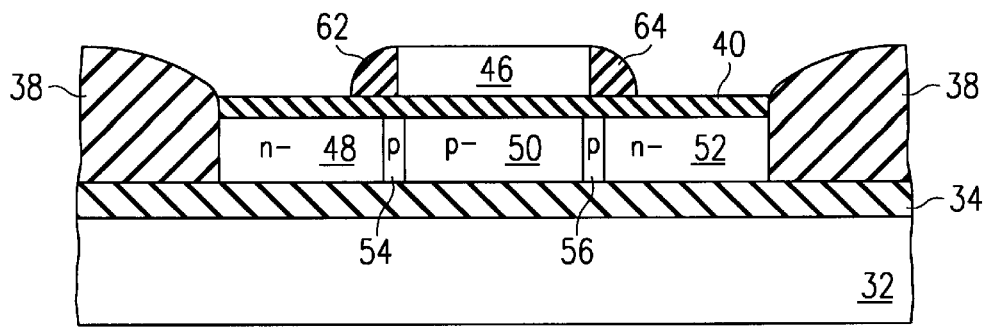

FIG. 1m shows the device after the layer of insulation is etched back leaving sidewall space formations 62 and 64.

Figure 1N:
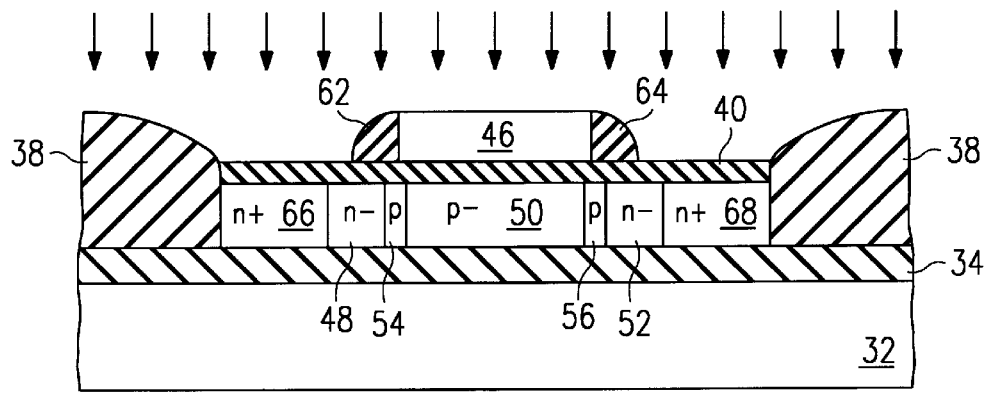

Subsequently, as show in FIG. 1n, another implant occurs. This implant is to form source and drain junctions. An n-type dopant is implanted to create an n+ level of dopant concentration.

The n+ concentration level indicates a concentration generally equal to or greater than $10^{20}/cm^3$. The resulting source and drain junctions 66 and 68, respectively, are n-type conductivity at the n+ concentration level.

Figure 1O:
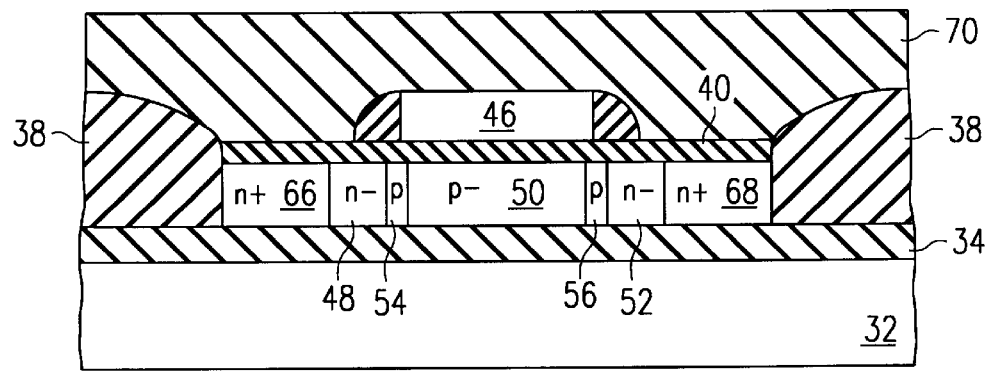

FIG. 1o shows a layer of insulator 70 laid over the top of the entire device.

Figure 1P:
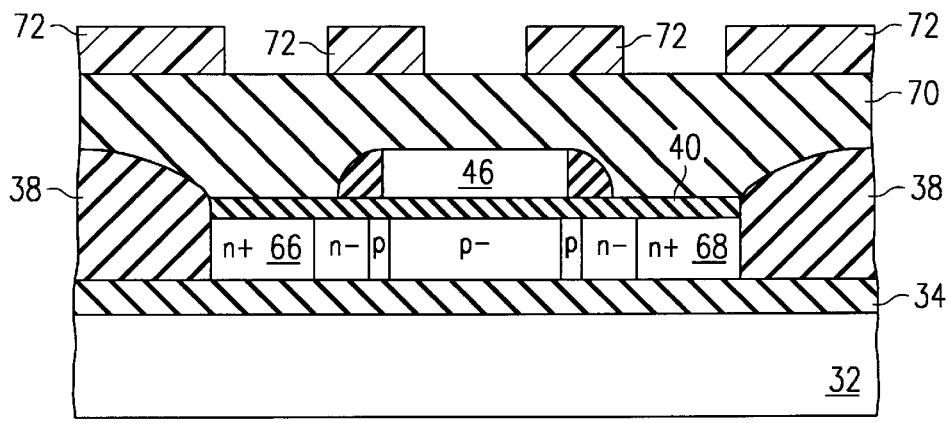

In FIG. 1p, there is shown a photoresist material 72 patterned to form contact holes in the insulating layers.

Figure 1Q:
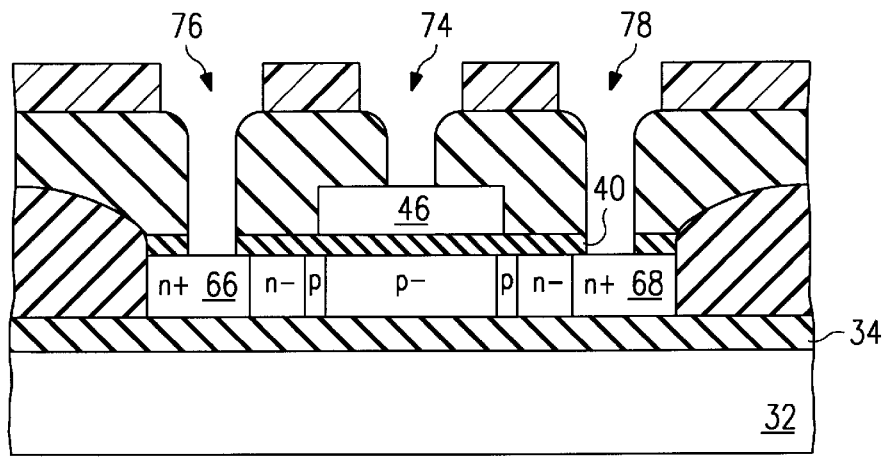

As shown in FIG. 1q, the insulator is etched through the photoresist mask down to the top surfaces of the gate 46, the source junction 66, and the drain junction 68. Thus gate, source and drain contact holes 74, 76, and 78 are formed.

Figure 1R:
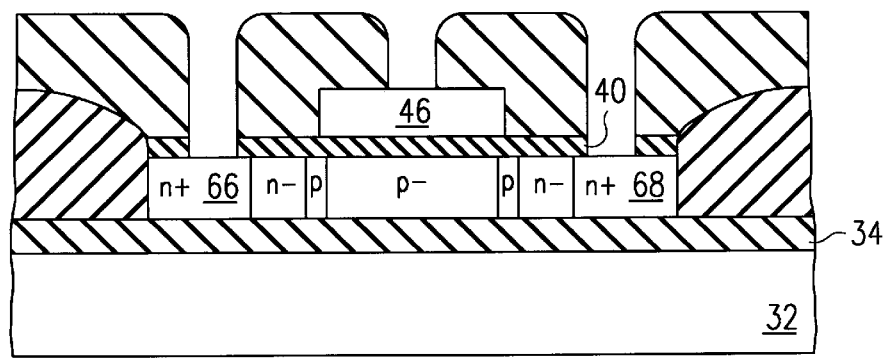

In FIG. 1r, the MOSFET transistor being fabricated is shown after the photoresist mask material is removed.

Figure 1S:
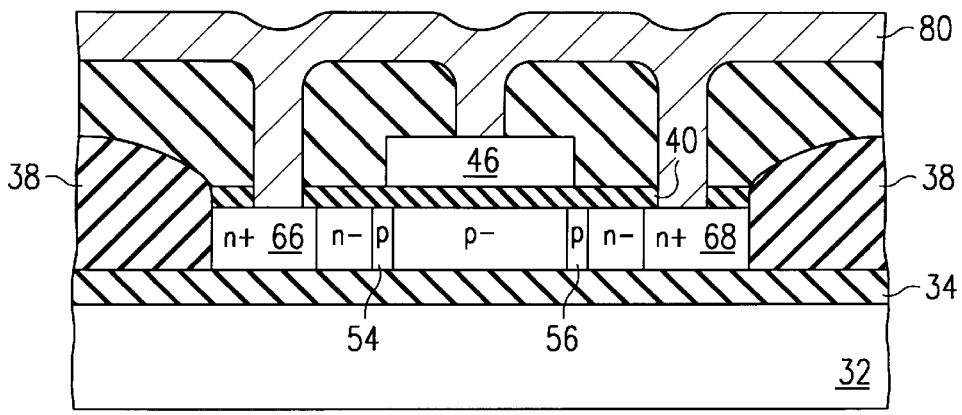

FIG. 1s shows the cross-section of the device after a layer of conductor 80 is laid over the entire top surface of the device. This conductor 80 fills the gate, source, and drain contact holes and makes contact with the gate 46, the source junction 66, and the drain junction 68.

Figure 1T:
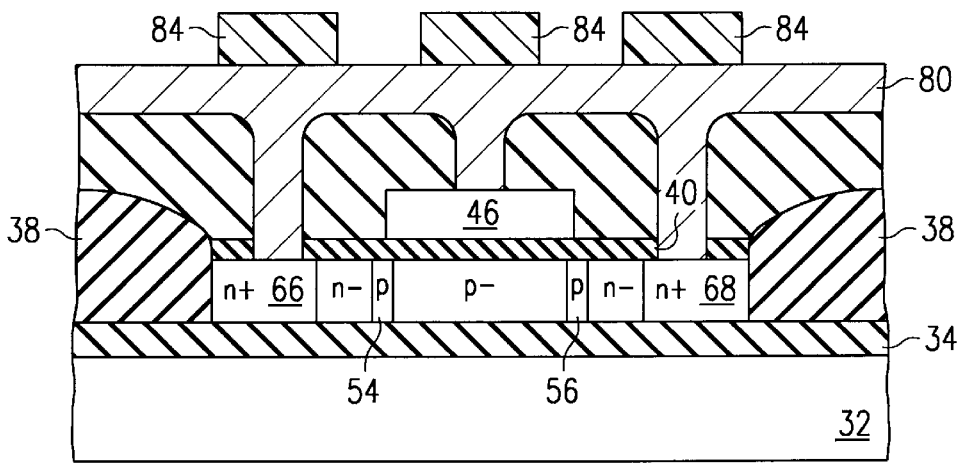
Figure 1U:
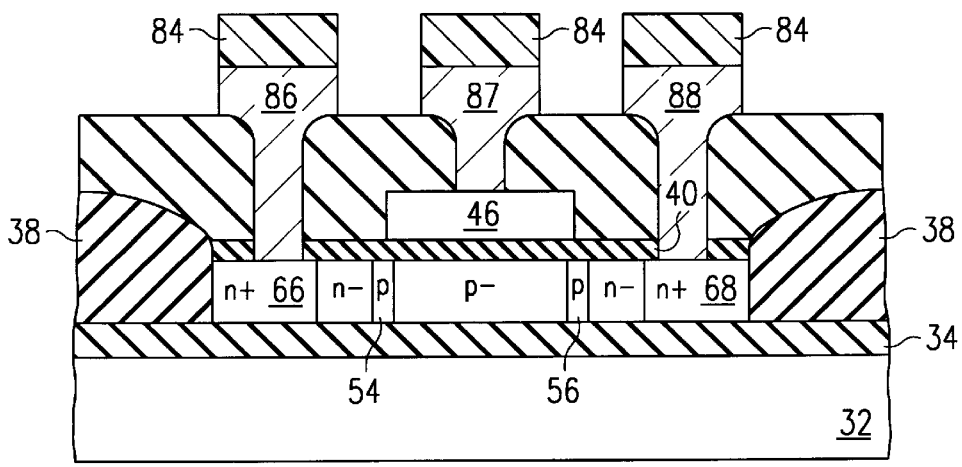

In FIG. 1t, there is shown a photoresist material 84 that is laid over the conductor 80 and patterned to form wordline (gate), bitline (source), and storage node (drain) connections.

FIG. 1u shows the MOSFET transistor being fabricated after the conductor 80 is etched away outside of the photoresist mask. There are left separate connections to the gate 46, the source junction 66, and the drain junction 68. Once the photoresist material 84 is removed, the separate connections 86, 87, and 88 can be connected to other elements of the integrated circuit in subsequent fabrication steps. While the exemplary transistor illustrated in FIG. 1 is symmetrical, the process can be modified to create an asymmetrical halo, for example the halo implant can be masked to be only on the source side.

Figure 2:
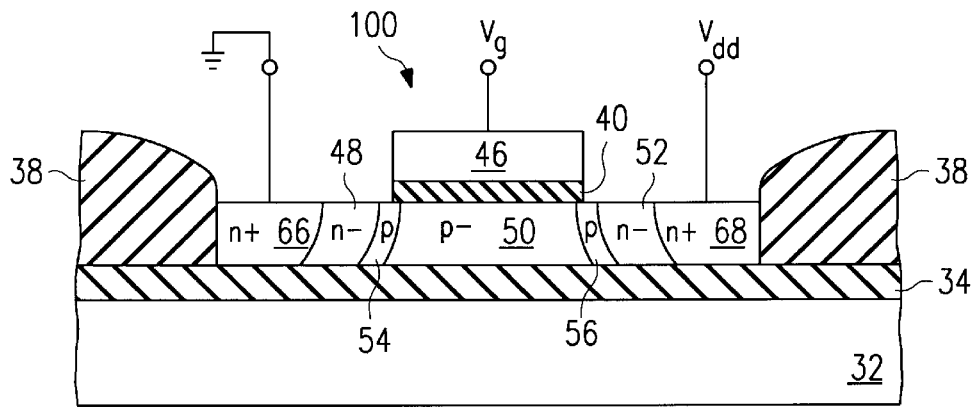
FIG. 2 presents a semiconductor on insulator transistor interconnected with voltage sources for operating the transistor.

Referring now to FIG. 2, there is shown the complete MOSFET transistor 100 interconnected with bias sources for operation. The source junction 66 is connected to a reference voltage, such as ground level, the drain junction is connected to the drain supply voltage $V_{dd}$, and the gate is connected to gate voltage $V_g$.

Figure 3:
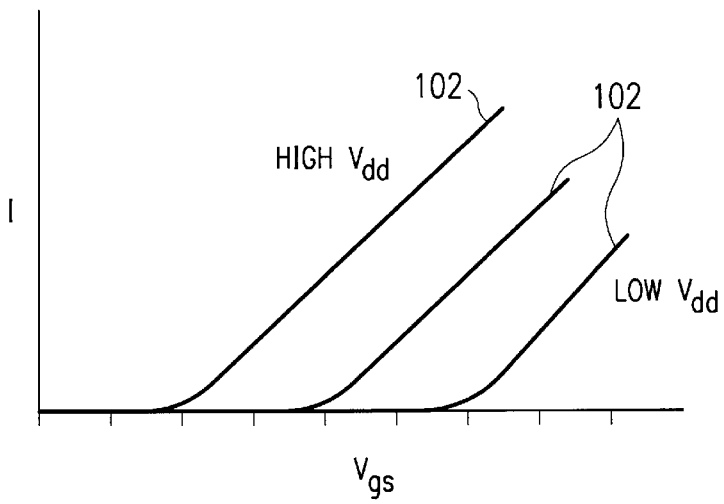
FIG. 3 shows an operating characteristic curve for a semiconductor on insulator transistor.

In operation, as shown in FIG. 3, the channel current I versus gate to source voltage $V_{gs}$ characteristic generally is similar to other MOSFET transistors. The threshold voltage for the device is a function of the magnitude of the drain supply voltage $V_{dd}$, as shown by the separate sloped curves 102. For each condition of operation, the threshold voltage is near the bend of the respective curve at the horizontal axis.

Figure 4:
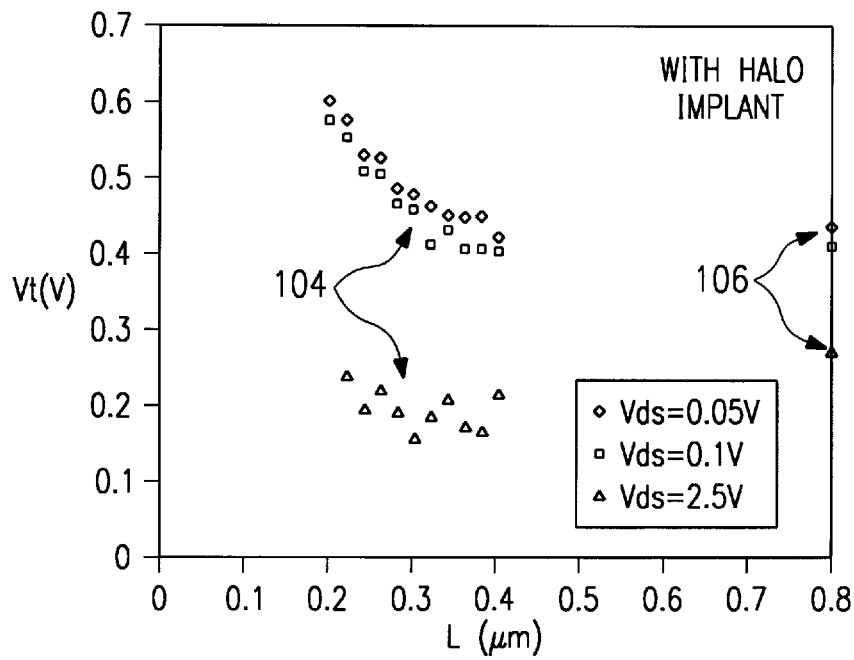
FIG. 4 shows a scatter plot of threshold voltage ($V_t$) versus channel length (L) for a semiconductor on insulator transistor, having a halo implant, for three different source to drain voltages.

FIG. 4 shows a scatter plot of threshold voltages for various drain to source voltages achieved by MOSFET transistor fabricated with the halo implant. It is noted that the plots 104 for short channel transistors of less than 0.4 μm of 2.5 volts, the threshold voltage $V_t$ remains constant near 0.2 volts. The threshold voltage $V_t$ does not drop off, or decrease, with decreasing channel length L.

At lower drain to source voltages of 0.1 volt and 0.05 volt, the threshold voltage $V_t$ also does not drop off, or decrease, with decreasing channel length. In fact the threshold voltage rises somewhat as the channel length becomes very short, below 0.3 μm. The deviation from the long channel threshold voltage can be controlled by the halo implant as determined by the implant conditions and subsequent thermal cycles. A halo implant can be chosen to minimize the channel length dependence of $V_t$ for the range of channel length and supply voltage of interest.

On the right hand vertical axis, there are plots 106 of relatively long channel devices. These plots for the long channel devices are under similar operating conditions for the short channel devices shown clustered in the center. It is noted that the threshold voltages $V_t$ for both the long channel devices and the short channel devices are near alike for each set of operating conditions.

In contrast to the performance of the previously described MOSFET transistor with the halo implant, prior art devices without the halo implant perform quite differently.

Figure 5:
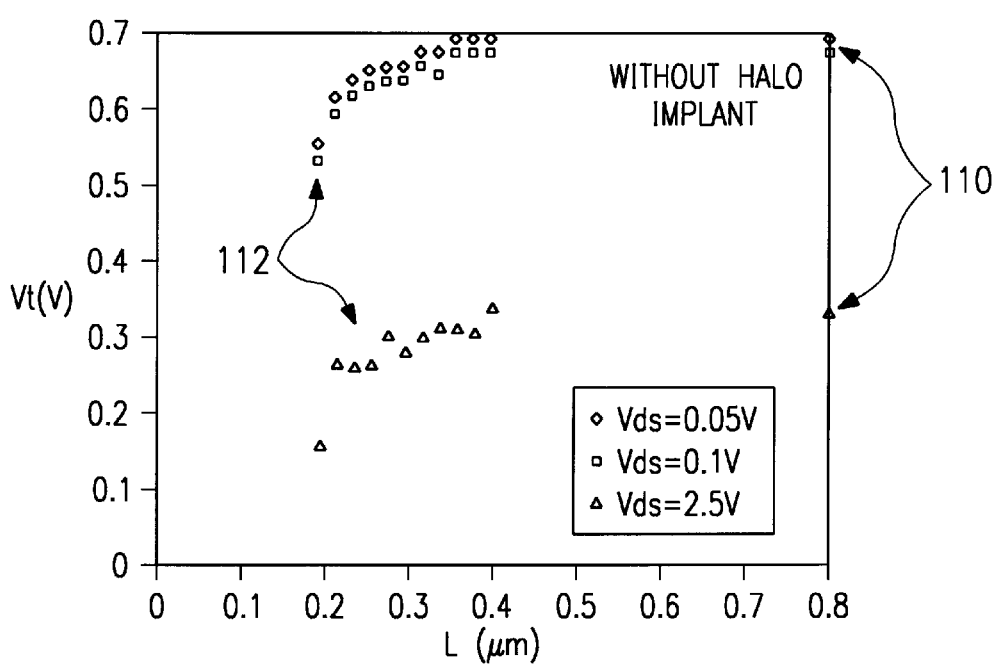
FIG. 5 shows a scatter plot of threshold voltage ($V_t$) versus channel length (L) for a semiconductor on insulator transistor, without a halo implant, for three different source to drain voltages.

In FIG. 5, there is a scatter plot of the threshold voltages for prior art semiconductor on insulator MOSFET transistors under operating conditions similar to the conditions represented in FIG. 4. It is noted that the threshold voltages for long channel devices 110 are relatively high. The threshold voltages remain relatively high for devices with channel lengths as short as approximately 0.3 μm. The plots of shorter and shorter channel lengths show that the threshold voltage decrease rapidly with decreasing channel length. As that trend continues with very short channel lengths, prior art semiconductor on the insulator MOSFET transistor cannot be controlled adequately for practical use.

Figure 6:
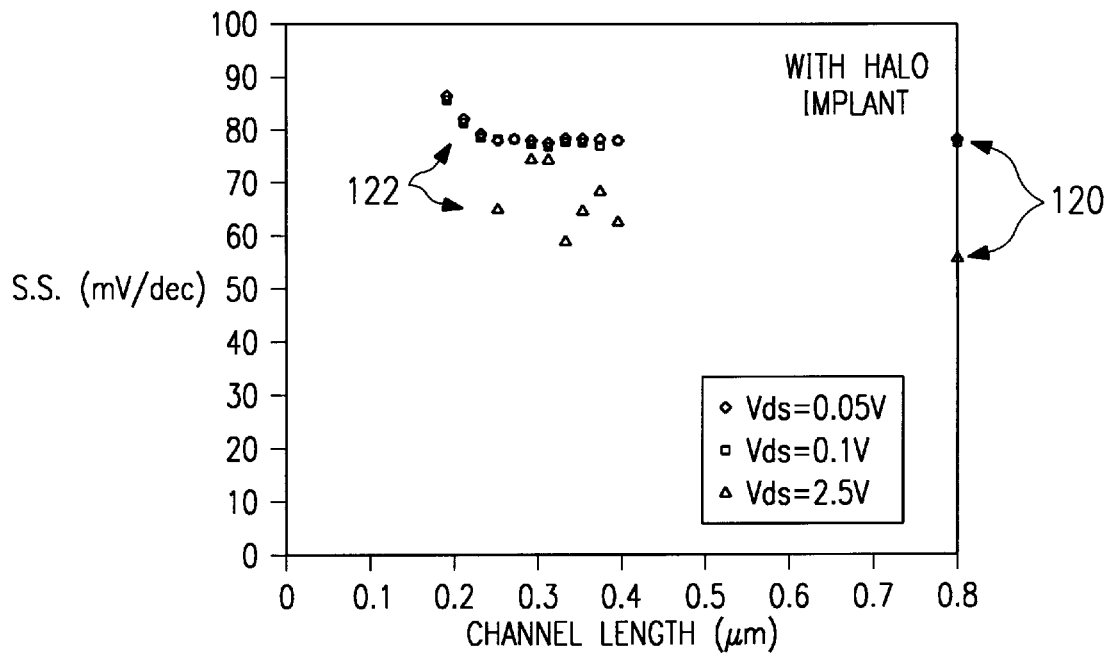
FIG. 6 shows a scatter plot of subthreshold slope versus channel length (L) for a semiconductor on insulator transistor, having a halo implant, for three different source to drain voltages.

FIG. 6 shows a scatter plot of the subthreshold slope for a MOSFET transistor fabricated with the halo implant. It is noted that the plots 122 for short channel transistors, channel of less than 0.4 um, the difference in subthreshold slopes between low drain bias (0.05v–0.1v) and high drain bias (2.5v) is less than approximately 20 mv/decade for this design.

Figure 7:
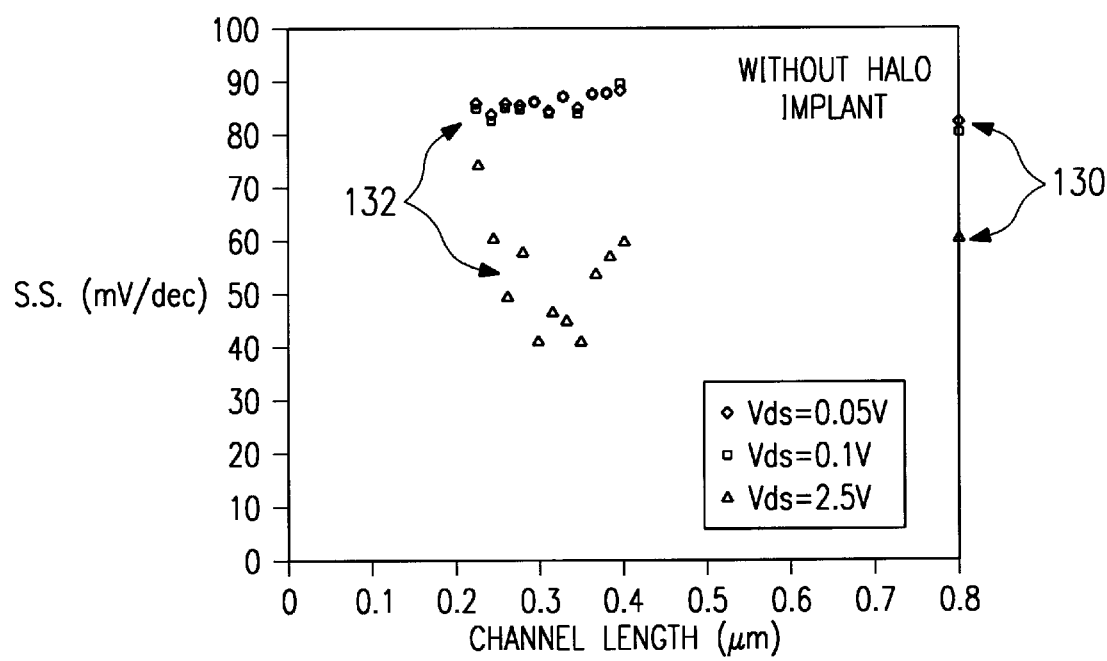
FIG. 7 shows a scatter plot of subthreshold slope for a semiconductor on insulator transistor, having a halo implant, for three different source to drain voltages.

FIG. 7 shows a scatter plot of the subthreshold slope for a prior art MOSFET without the halo implant. It is noted that plots 132 for short channel transistors, of less than 0.4 um, the difference in subthreshold slopes between low drain bias (0.05–0.1 volt) and high drain bias (2.5 volt) is much larger than the exemplary MOSFET transistor having the halo implant. For the MOSFET transistor without the halo implant, the difference in subthreshold slopes is 35 mv/decade on average. This is a clear indication of the floating body effect. The floating body effect is illustrated subsequently in FIG. 8.

Figure 8:
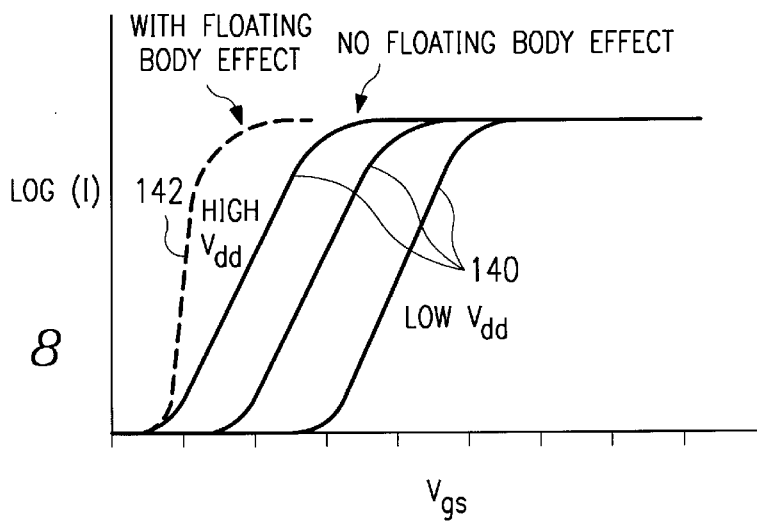
FIG. 8 presents another operating characteristic curve for a semiconductor on insulator transistor.

FIG. 8 shows the logarithmic channel current log (I) versus gate to source voltage characteristic of the device having a halo implant, as shown in FIG. 2. Because of the halo implant, the floating body effect is reduced and subthreshold slope remains fairly constant with low and high drain biases, as shown by curves 140. Without the halo implant, the floating body effect is prominent and the subthreshold slope of an SOI MOSFET device decreases rapidly with increase of drain bias, as illustrated in curve 142 of FIG. 8.

Figure 9A:
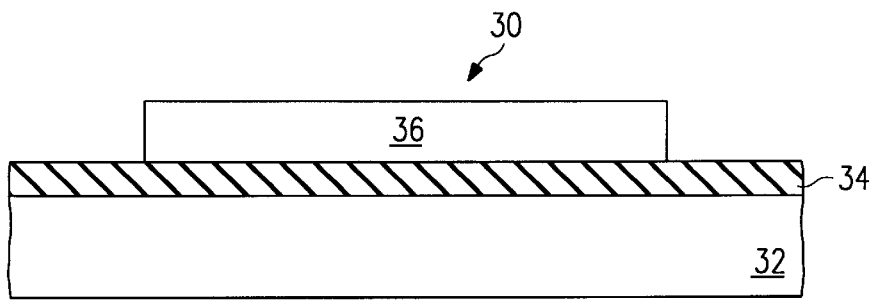
FIGS. 9a–9u show a series of cross-sections of an integrated circuit being fabricated into another semiconductor on insulator transistor.
Figure 9B:
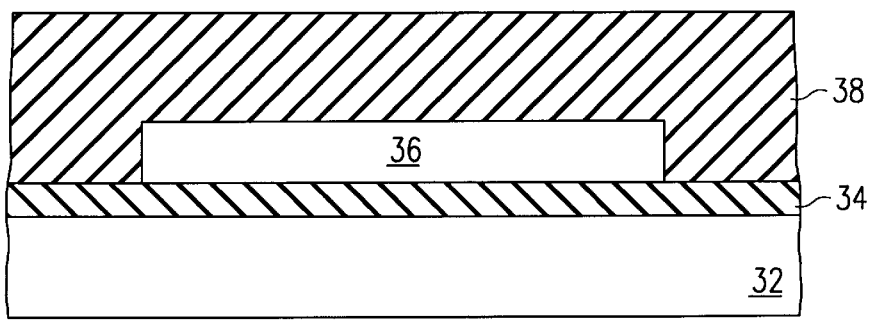
Figure 9C:
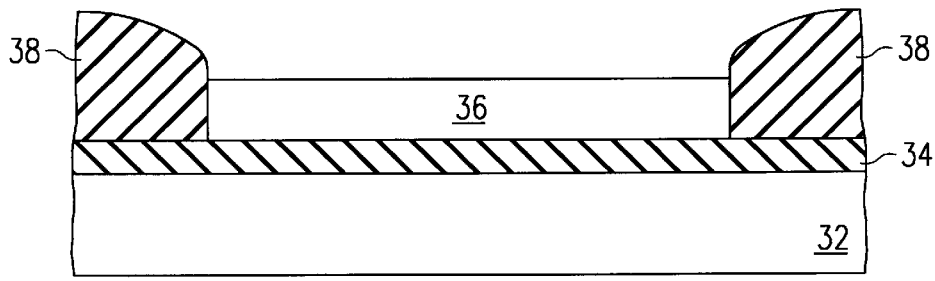
Figure 9D:
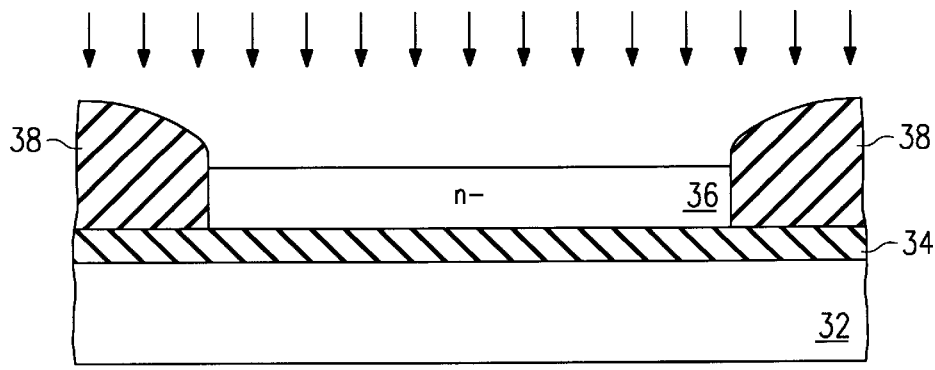
Figure 9E:
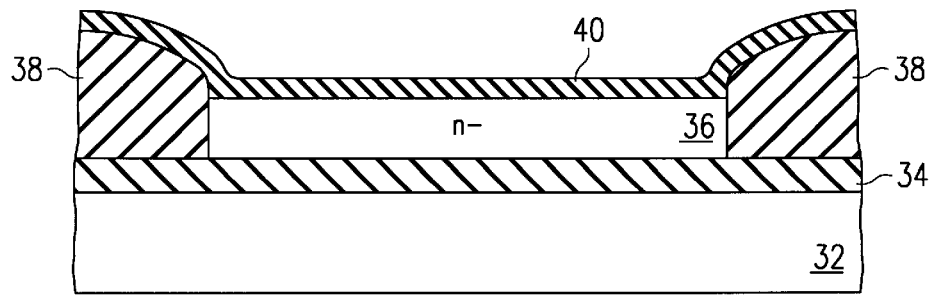
Figure 9F:
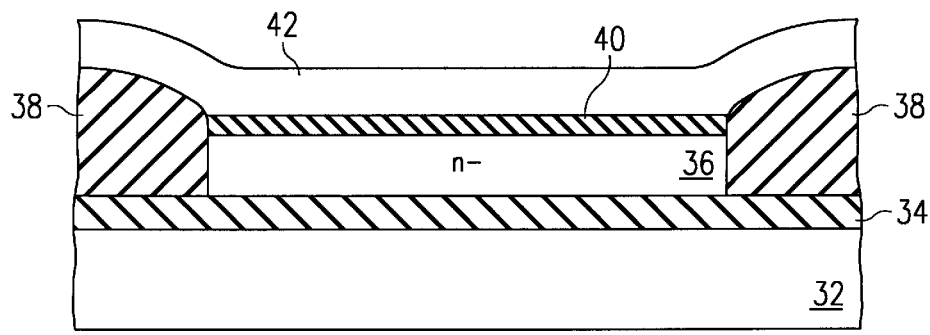
Figure 9G:
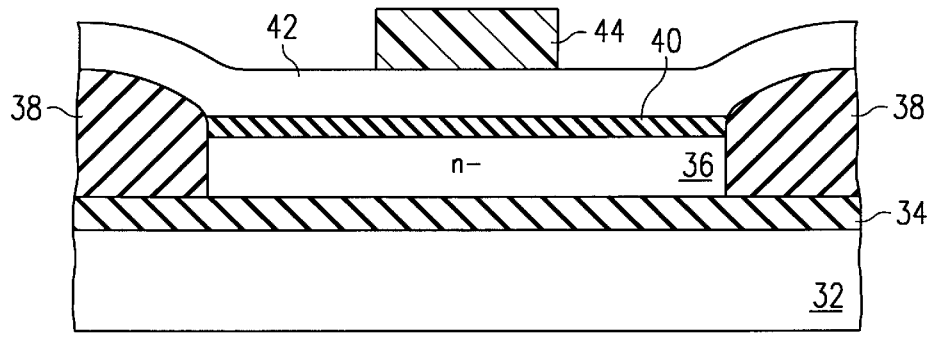
Figure 9H:
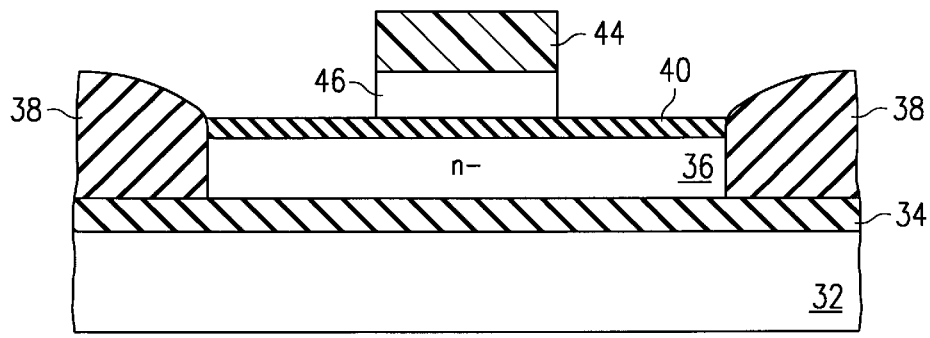
Figure 9I:
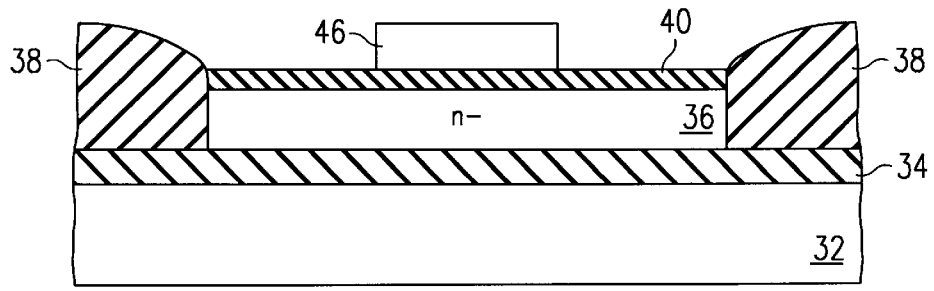
Figure 9J:
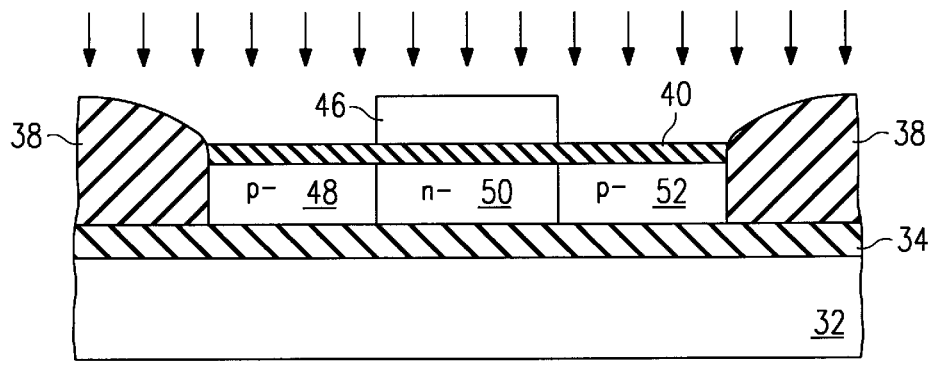
Figure 9K:
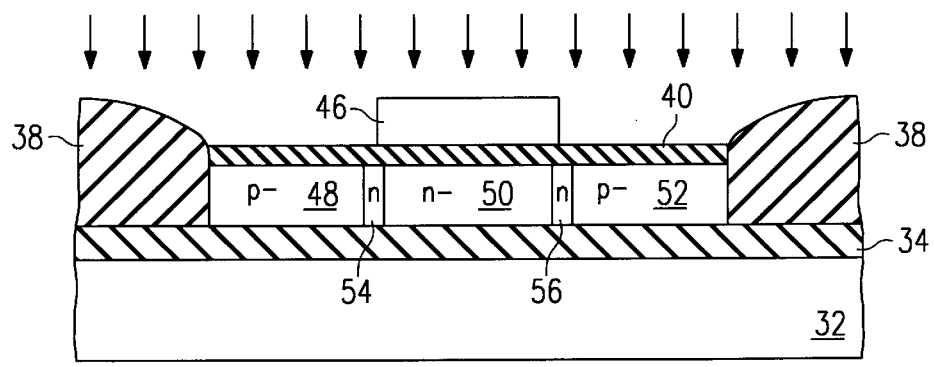
Figure 9L:
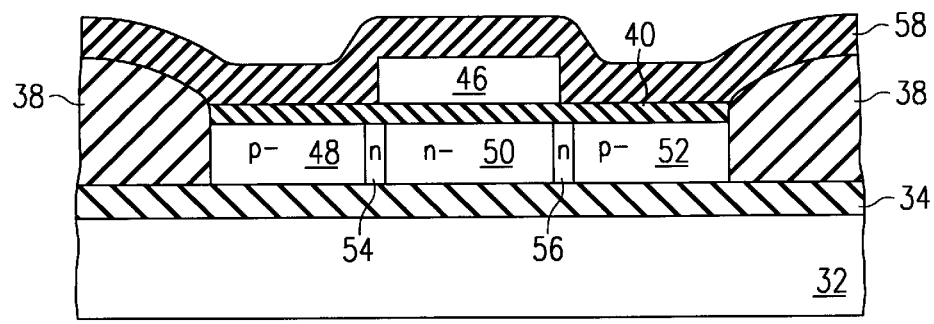
Figure 9M:
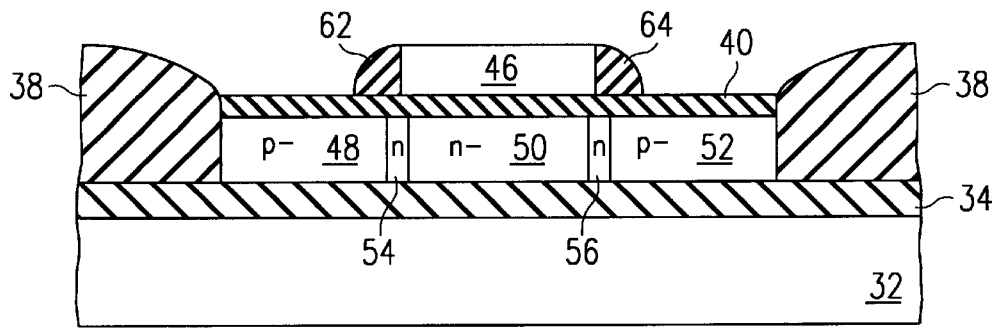
Figure 9N:
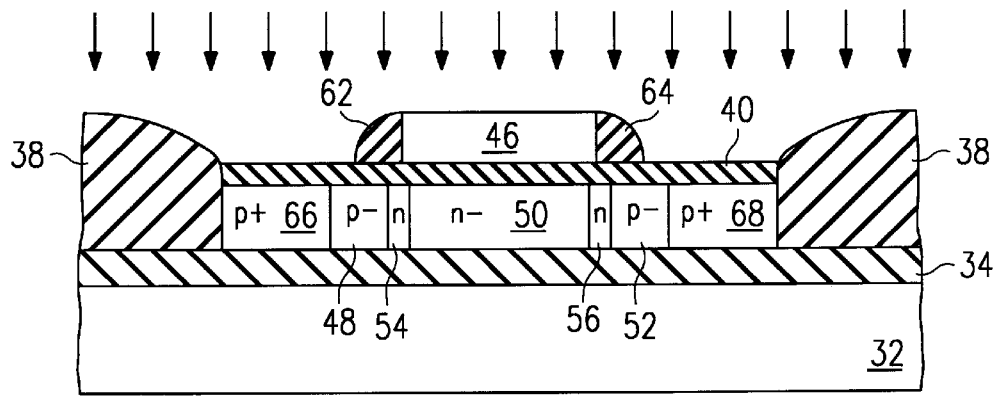
Figure 9O:
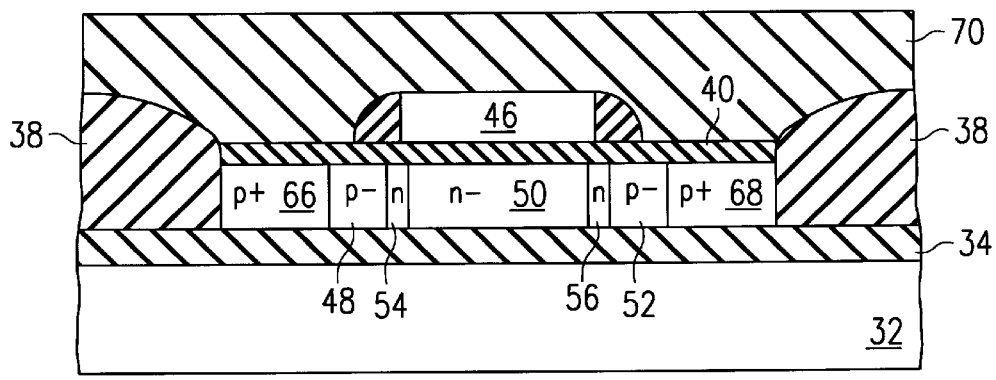
Figure 9P:
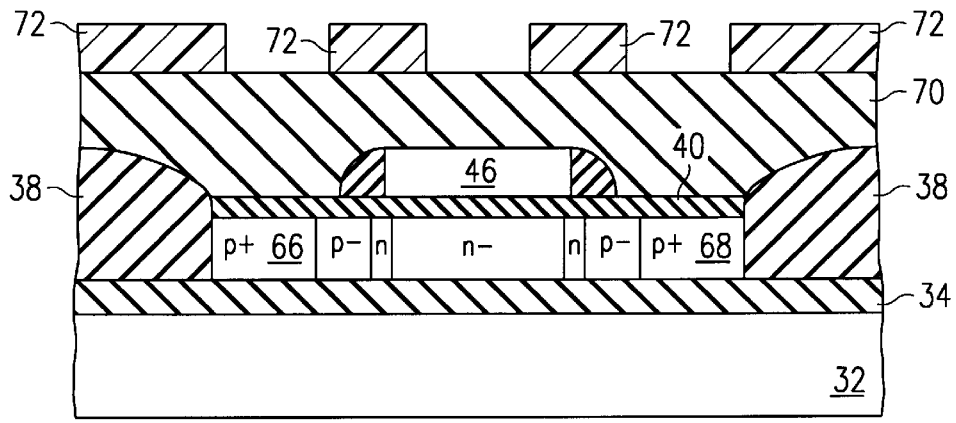
Figure 9Q:
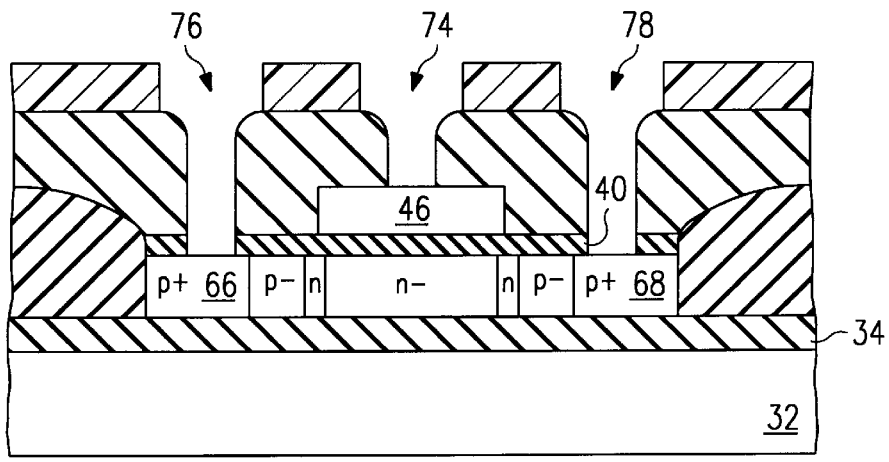
Figure 9R:
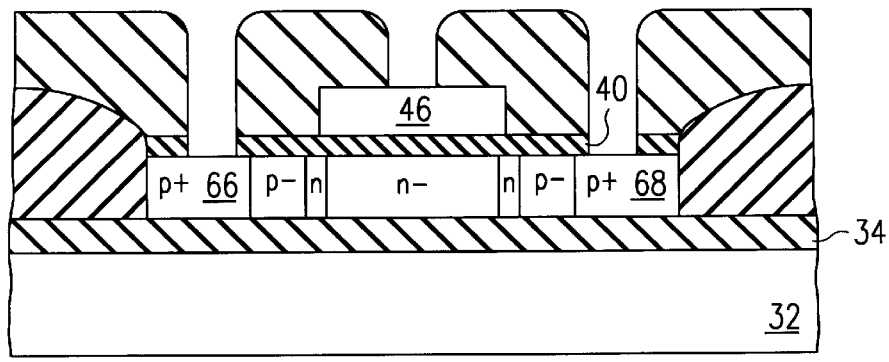
Figure 9S:
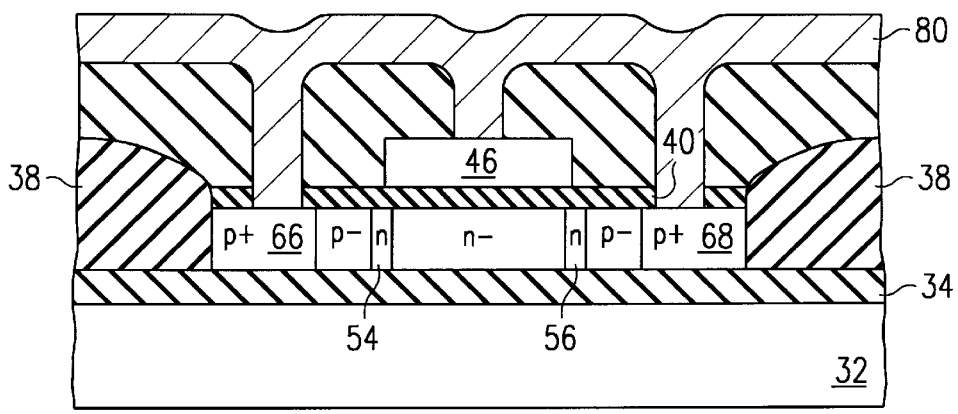
Figure 9T:
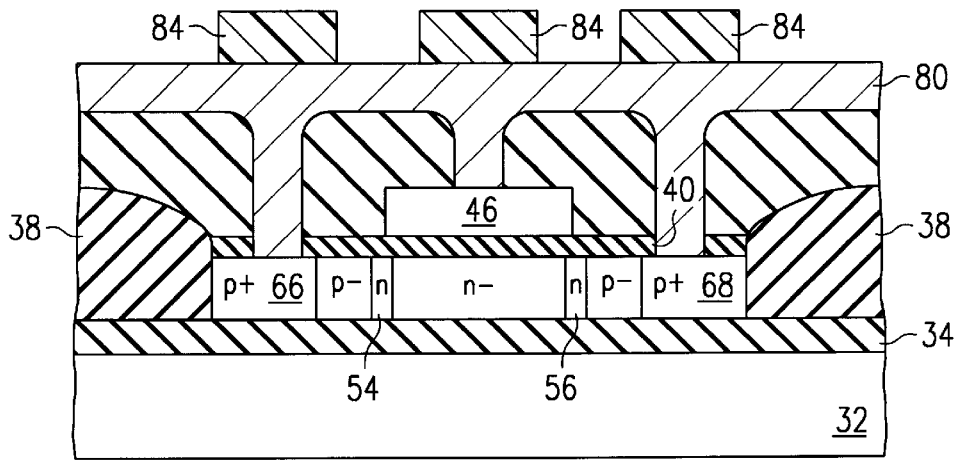
Figure 9U:
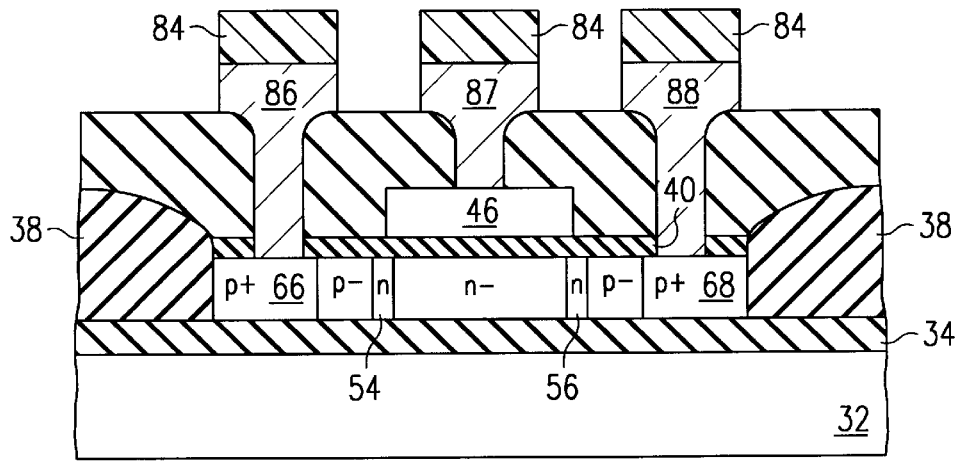

FIGS. 9a–9u illustrate an exemplary sequence of steps for fabricating a p-channel semiconductor on insulator MOSFET transistor with a halo implant. The steps of fabrication are similar to the steps of fabrication of the n-channel transistor, as described with respect to FIGS. 1a–1u. Doping materials must be selected to account for the different polarities of the various regions of the device. The polarities of the regions are clearly shown in FIGS. 9a–9u. Each of those figures correlates with a similar figure having the same letter designation in FIGS. 1a–1u.

In a CMOS process, the use and specification of a halo implant can be made independently for the n-channel and the p-channel transistors. Transistors of the same conductivity type with different or no halo specification can also be integrated.

Figure 10:
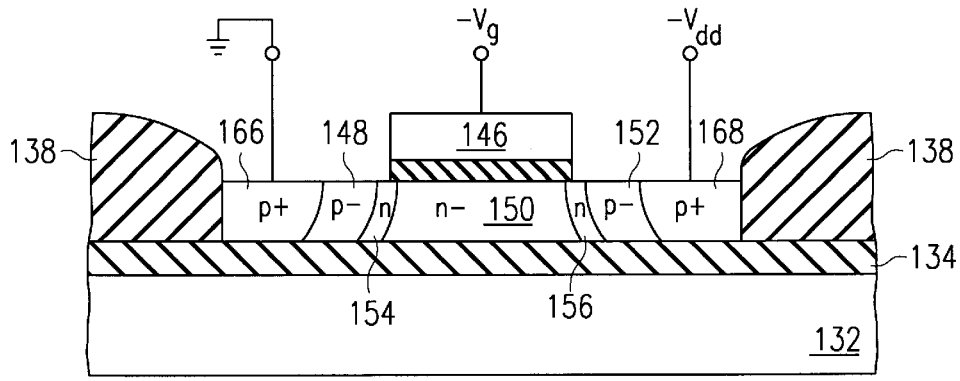
FIG. 10 presents another semiconductor on insulator transistor interconnected with voltage supply sources for operating the transistor.

FIG. 10 shows the p-channel semiconductor on insulator MOSFET transistor interconnected with bias sources for operation. The source junction 166 is connected with ground. Gate 146 is connected to a gate voltage $-V_g$, and drain junction 168 is connected to a drain supply voltage $-V_{dd}$. The threshold voltage $V_t$ for any set of operating conditions is relative consistent for long channel and short channel transistors.

In addition to fabricating the previously described semiconductor on insulator MOSFET transistor devices, similar fabrication processes can be used for fabricating advantageous semiconductor on insulator bipolar transistor. Such bipolar transistor devices and fabrication processes are to be described presently. These devices and fabrication processes are presented as an example but it is considered that other processing sequences can produce the same results.

Figure 11A:
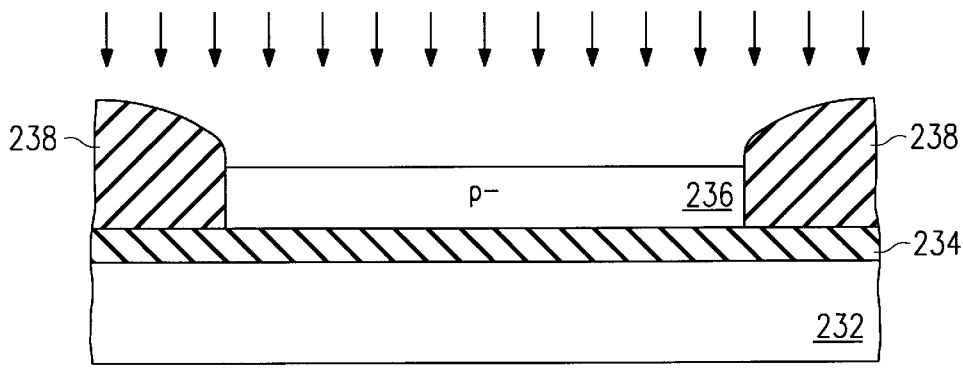
FIGS. 11a–11k show a series of cross-sections of an integrated, circuit being fabricated into another semiconductor transistor.

Referring now to FIG. 11a, there is shown a starting material for fabricating a semiconductor on insulator NPN bipolar transistor device. A semiconductor substrate 232 has a layer of insulator 234 laid over it. The substrate 232 may be silicon, for example. Also as an example, silicon dioxide or sapphire can be used for the insulator 234. On top of the insulator 234, a layer of semiconductor, which may be silicon, is laid and formed into a mesa. The semiconductor mesa 236 is a single crystal. As previously mentioned, there are several known methods to fabricate the mesa semiconductor material 236 on the insulator 234.

As shown in FIG. 11a, the top of the device is exposed to an implant operation for establishing a level of dopant in the semiconductor mesa. In the present example, a p-type dopant is used to start creating a p-type base region for an NPN bipolar transistor. Examples of a suitable p-type dopant material are boron, gallium, and indium. The amount of dopant is controlled so that a resulting dopant concentration in the channel region is relatively low. The low concentration level is represented by a designation p- and generally is in a range from $10^{14}/cm^3$ to $10^{18}/cm^3$. After the dopant level is established in the mesa 36, the top of the mesa is covered with an insulator.

Figure 11B:
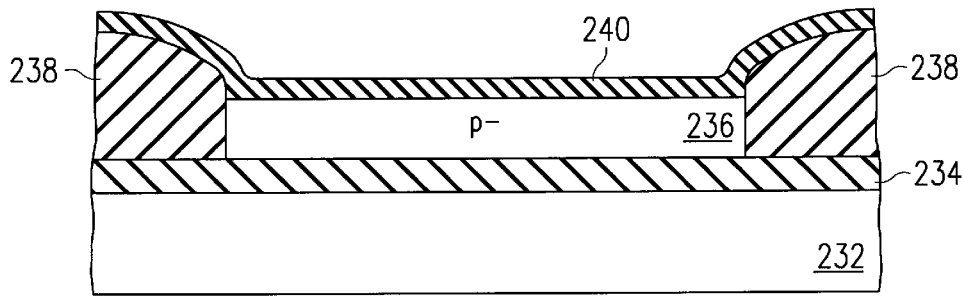

In FIG 11b, there is shown the cross-section of the device following steps of growing or depositing an insulator 238 over all of the top of the device. The insulator 238 may be silicon dioxide. Subsequently, the insulator is etched back over all to expose the top surface of the semiconductor mesa 236. The remaining insulator 238 and the layer 234 isolate the mesa of semiconductor material 236 from other circuit elements to prevent cross-talk between the subject device and any other devices. Also shown is a layer of insulation 240 laid over all. In subsequent figures, the part of the layer of insulation 240 which overlays the insulation regions 238 will be merged together as the region 238.

Figure 11C:
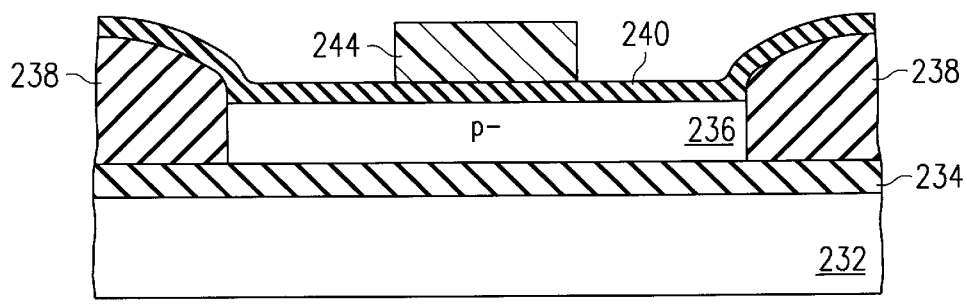

FIG. 11c shows the device after a photoresist material 244 is deposited over the top of the device and is patterned into a mask for forming the emitter and collector regions.

Figure 11D:
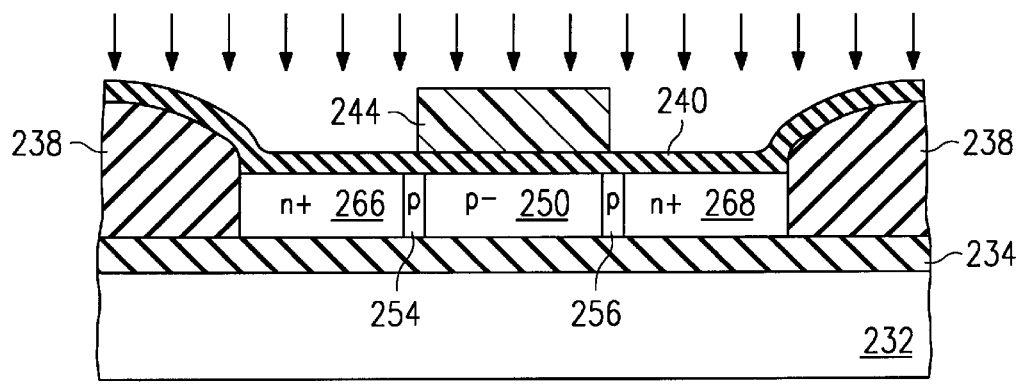

FIG. 11d illustrates a step for making emitter and collector region implants 266 and 268. The n-type dopant, for example, arsenic or phosphorous, is implanted through the insulator layer 240. A resulting high concentration level of the dopant is designated in FIG. 11d by the symbol n+ and generally is in the range equal to or greater than $10^{20}/cm^3$. Thus the device being fabricated now has an emitter region 266, a base region 250, and a collector region 268. The emitter and collector-regions 266 and 268 have high concentrations of the n-type dopant, and the base region 250 has a low concentration of p-type dopant.

As further shown in FIG. 11d, another implant follows. This implant is a halo implant. The dopant is a p-type dopant that is implanted to produce an intermediate concentration levels, designated by the symbol p. This intermediate concentration level is in a range from $10^{14}/cm^3$ to $10^{19}/cm^3$. The dopant material for the halo implant is selected to be more diffusive than the n-type dopant material residing in the emitter and collector regions 266 and 268. Alternatively angle implant or multiple spacer steps can be used to form the halo. After the halo implant material is implanted into the emitter and collector regions 266 and 268, subsequent steps of fabrication, such as anneals, cause the halo dopant to diffuse toward the base region 250. Thus the halo dopant forms the halo implant regions 254 and 256, shown in FIG. 11d. It is noted that the halo implant regions 254 and 256 completely separate the emitter and collector regions 266 and 268, respectively, from the base region 250. After the implants are completed, the photoresist mask 244 is removed.

Figure 11E:
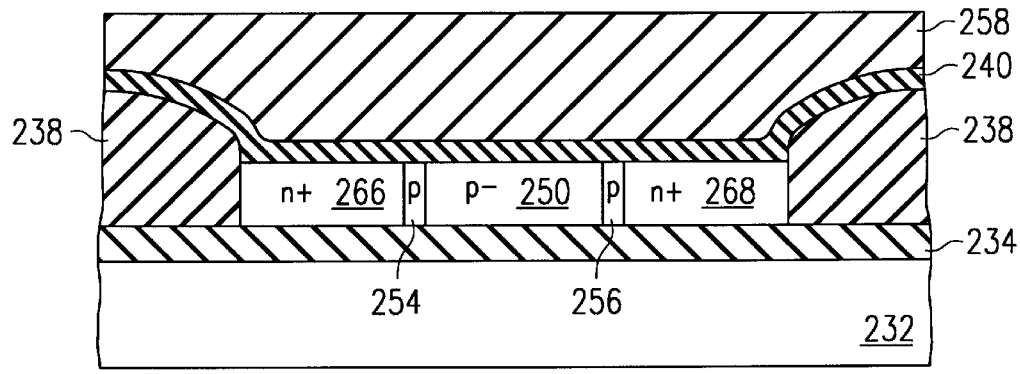

In FIG. 11e, a layer of oxide insulation 258 is formed over the top of the device.

Figure 11F:
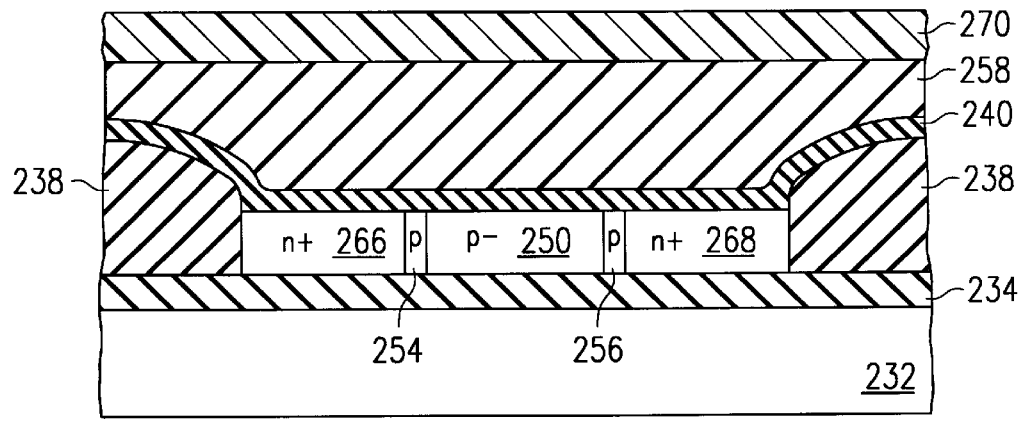

FIG. 11f shows a layer of photoresist material 270 laid over the top of the entire device.

Figure 11G:
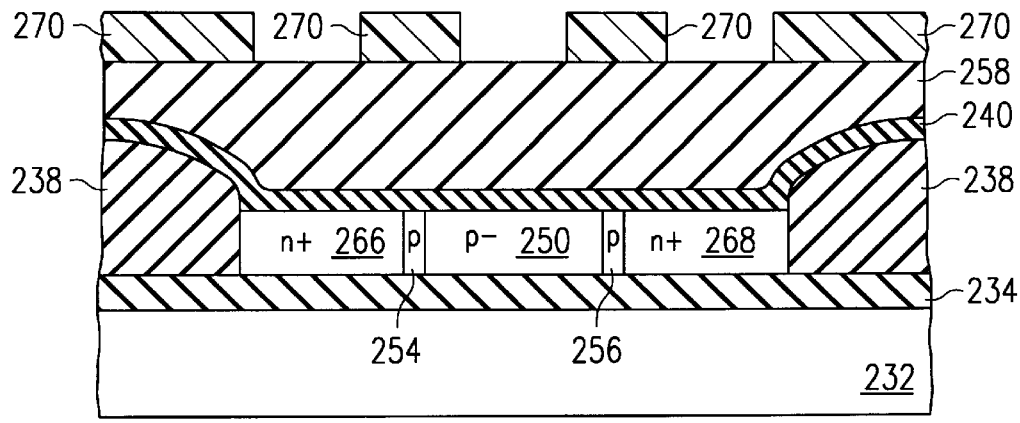

In FIG. 11g, there is shown the photoresist material 270 patterned to form contact holes in the oxide layers.

Figure 11H:
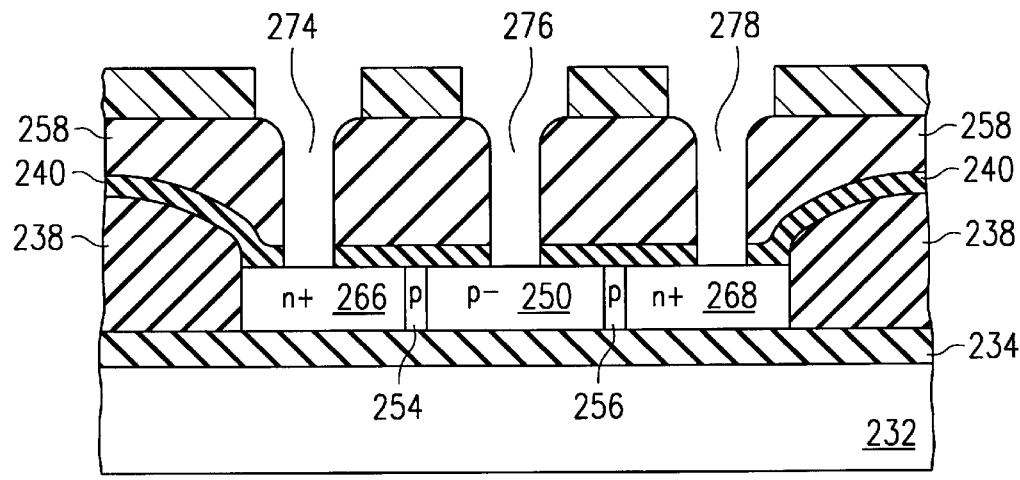

As shown in FIG. 11h, the oxide is etched through the photoresist mask down to the top surfaces of the emitter region 266, the base region 250, and the collector region 268. Thus emitter, base and collector contact holes 274, 276, and 278 are formed.

Figure 11I:
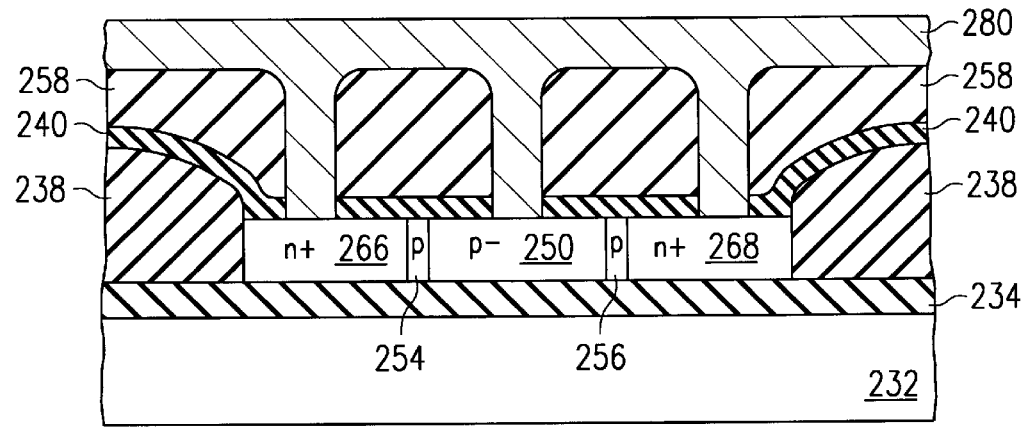

In FIG. 11i, the NPN bipolar transistor, being fabricated, is shown after the photoresist mask material is removed and a layer of conductor 280 is laid over the entire top surface of the device. This conductor 280 fills the emitter, base, and collector contact holes and makes contact with the emitter region 266, the base region 250, and the collector region 268.

Figure 11J:
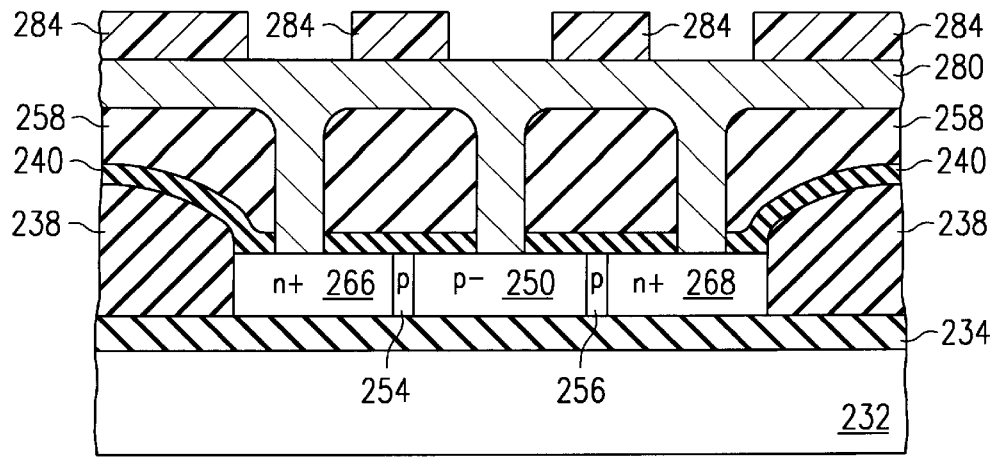

In FIG. 11j, there is shown a photoresist material 284 that is laid over the conductor 80 and patterned to form emitter, base, and collector connections.

Figure 11K:
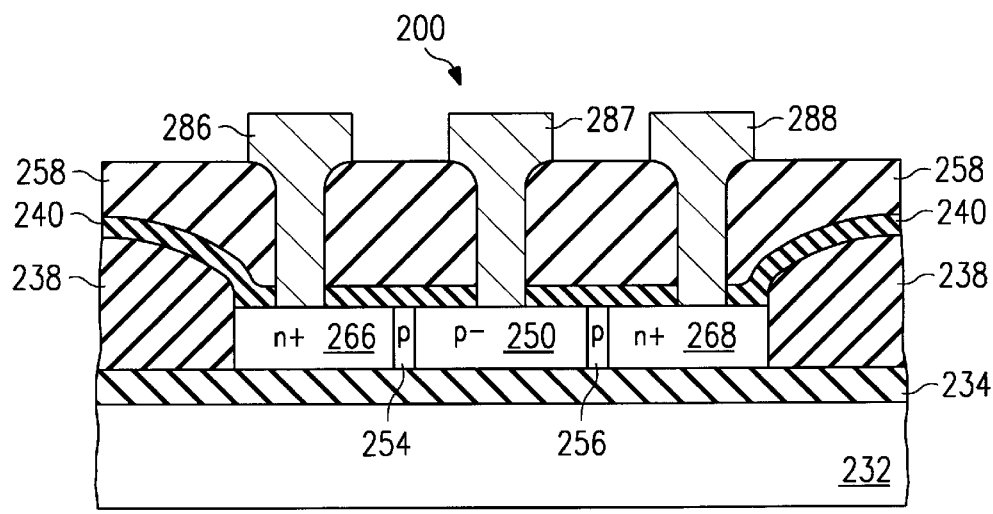

FIG. 11k shows the NPN bipolar transistor, being fabricated, after the conductor 80 is etched away outside of the photoresist mask. There are left separate connections to the emitter, region 266, the base region 250, and the collector region 268. Once the photoresist material 284 is removed, the separate connections 286, 287, and 288 can be connected to other elements of the integrated circuit in subsequent fabrication steps.

FIGS. 11a–11k illustrate the sequence of steps for fabricating a semiconductor on insulator NPN bipolar transistor with a halo implant. The steps of fabrication are similar to the steps of fabrication of the n-channel MOSFET transistor, as described with respect to FIGS. 1a–1u. Doping materials must be selected to account for the different polarities of the various regions of the device.

FIG. 11k, shows the cross-section of an NPN semiconductor on insulator bipolar transistor 200. It is noted that the elements, or parts, of FIG. 11 are identified by numbers in the two hundreds with the same tens and units numerals used in FIGS. 1a–1u. As a result, the fabrication process of FIGS. 11a–11k, produces the NPN transistor 200. The n-type emitter region 266 is separated from the n-type collector region 268 by a p-type base region 250. A conductive emitter electrode 286 is directly in contact with the emitter contact region 266. A conductive base electrode 287 is directly in contact with the base region 250. A collector electrode 288 is directly in contact with the collector contact region 268. The halo implants 254 and 256, respectively, completely separate the emitter and collector regions 266 and 268 from the base region 250.

Figure 12:
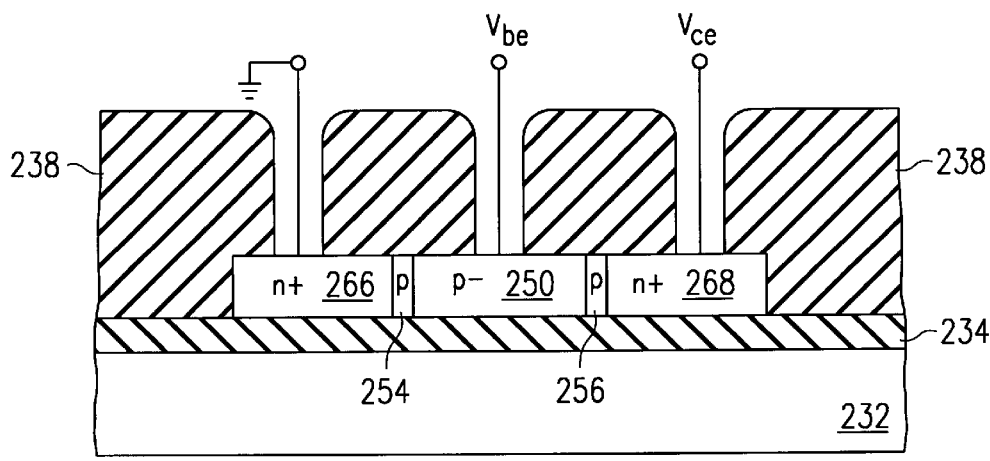
FIG. 12 presents a semiconductor on insulator transistor interconnected with voltage sources for operating the transistor.
Figure 13A:
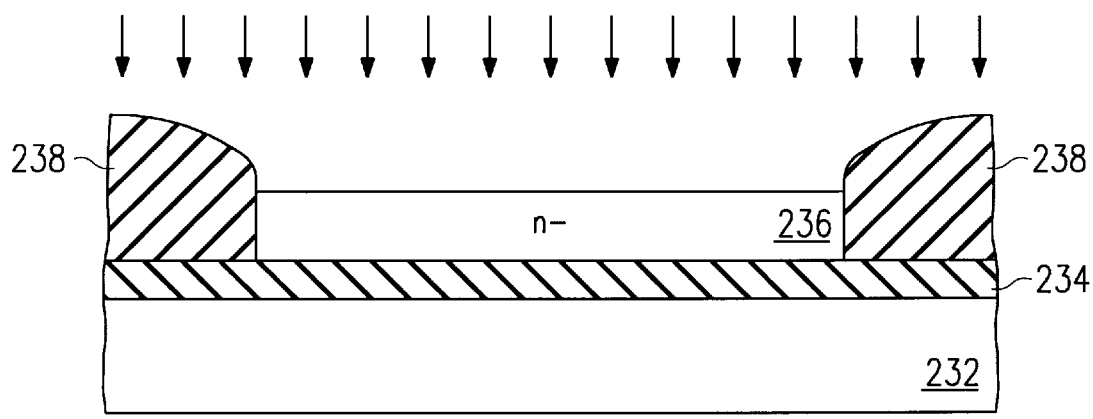
FIGS. 13a–13k show a series of cross-sections of an integrated circuit being fabricated into yet another semiconductor on insulator transistor.
Figure 13B:
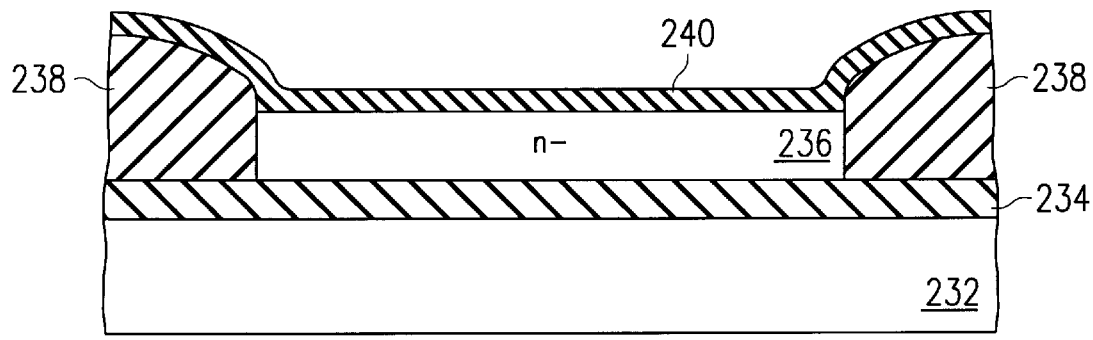
Figure 13C:
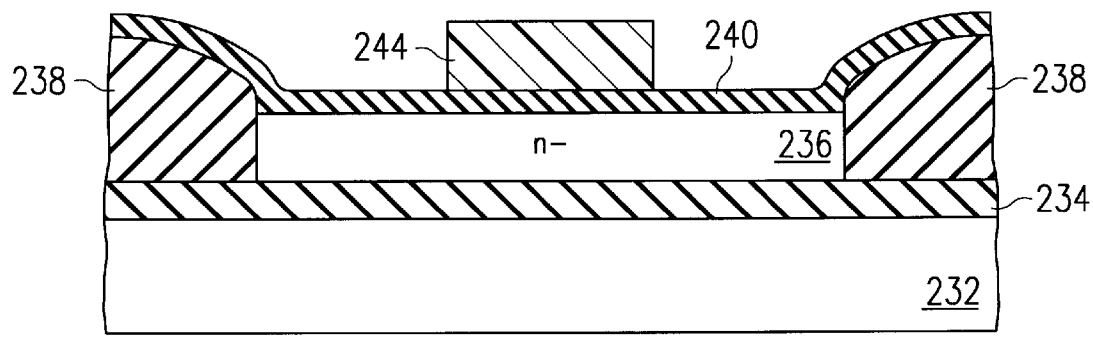
Figure 13D:
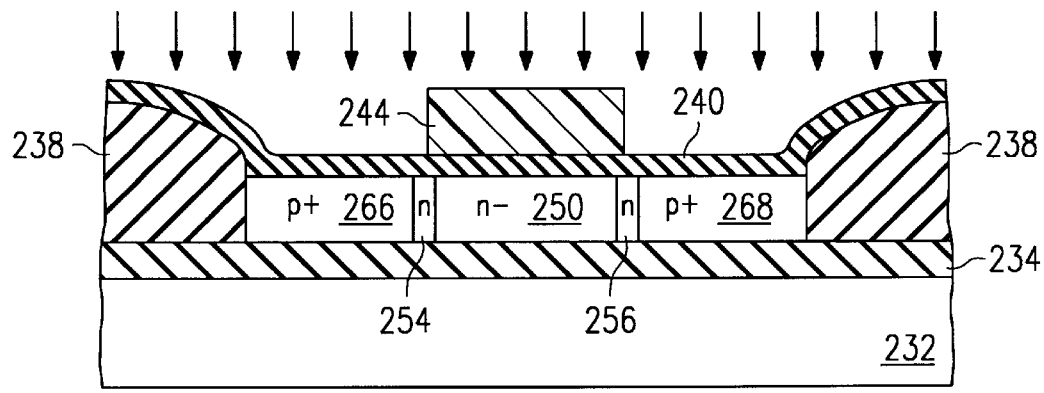
Figure 13E:
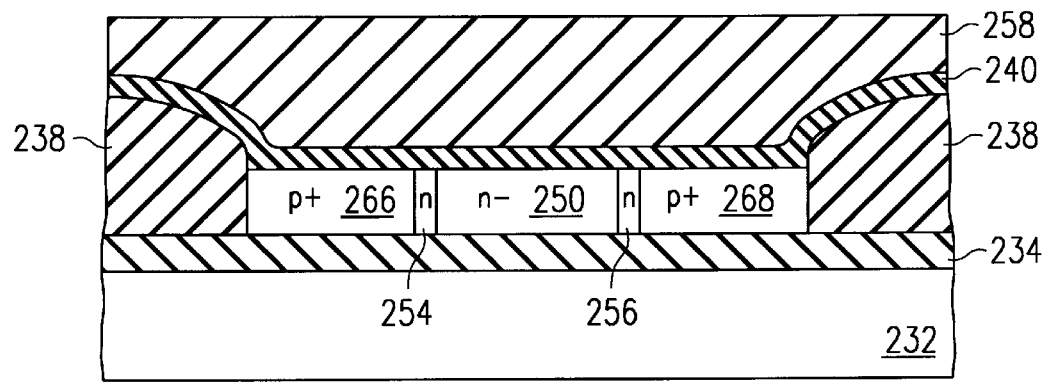
Figure 13F:
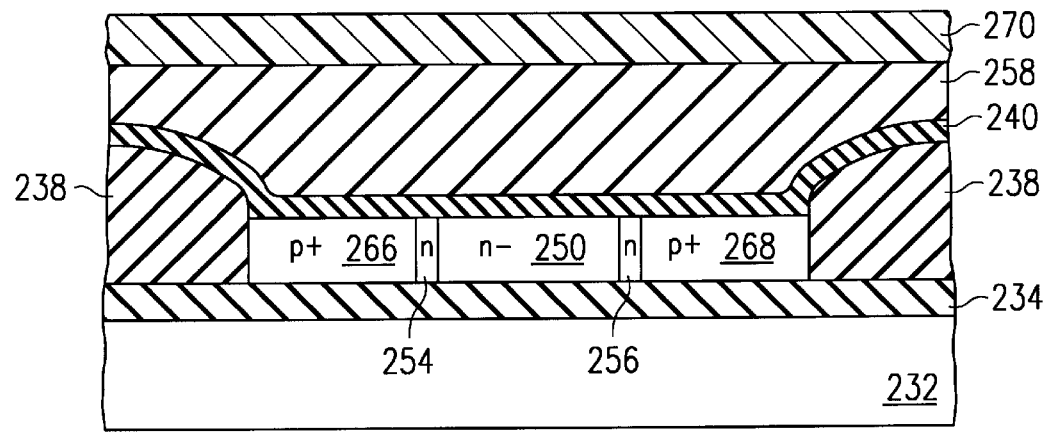
Figure 13G:
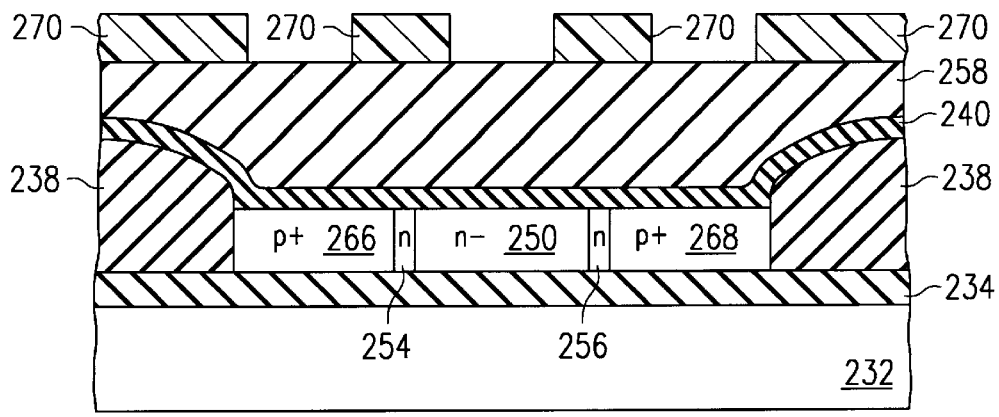
Figure 13H:
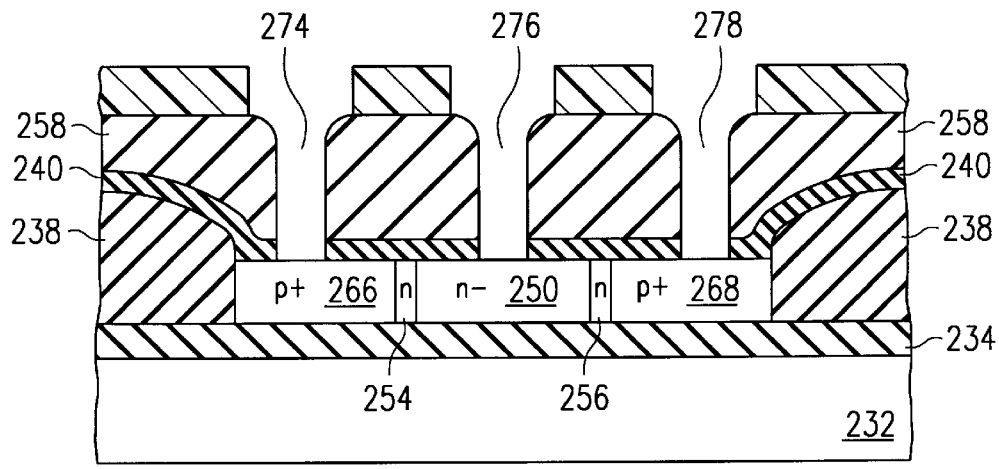
Figure 13I:
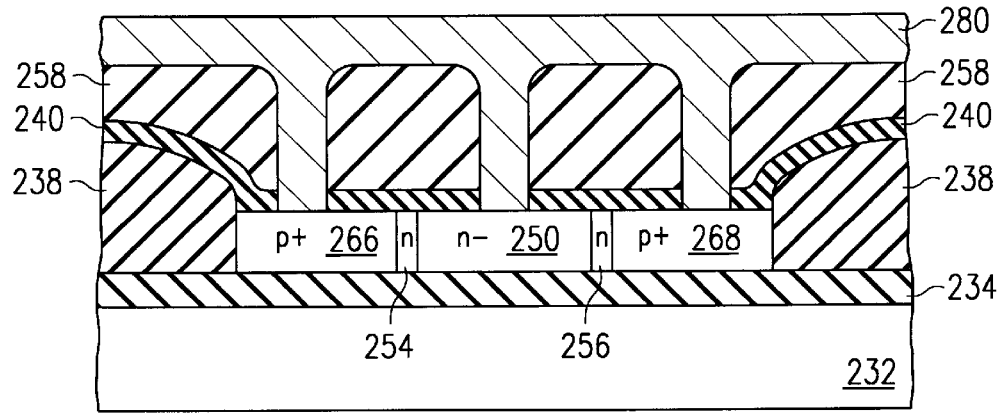
Figure 13J:
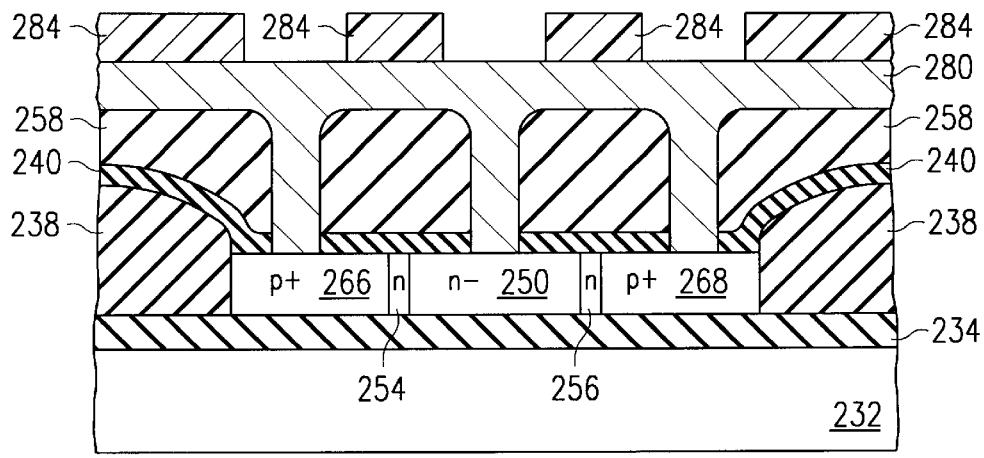
Figure 13K:
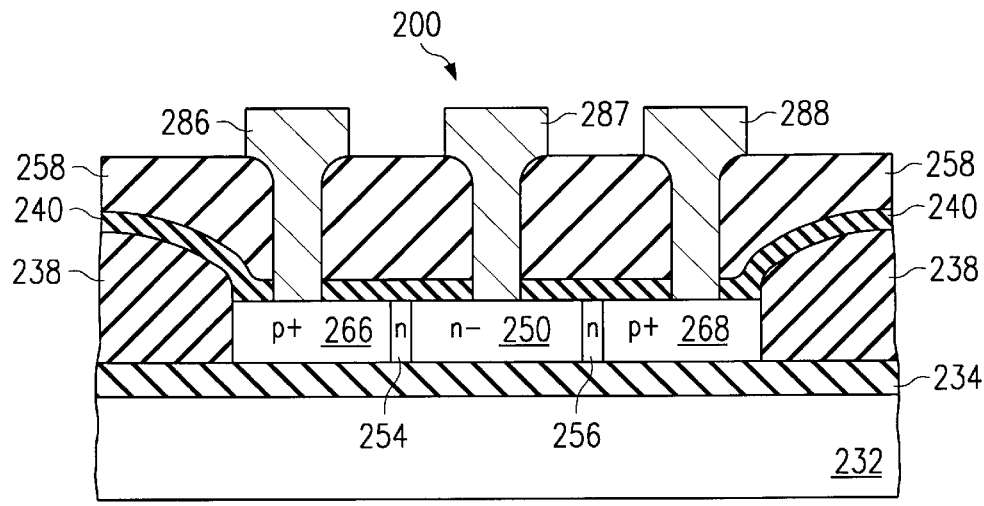

As shown in FIG. 12, the semiconductor on insulator NPN transistor 200 is biased for operation similar to other NPN bipolar transistors. For example, the emitter contact region 266 is connected to ground potential, the base contact region 250 is connected to the base input voltage $V_{be}$, and the collector contact region 268 is connected to the collector bias supply voltage $V_{ce}$.

FIGS. 13a–13k illustrate the sequence of steps for fabricating a PNP semiconductor on insulator bipolar transistor with a halo implant. The steps of fabrication are similar to the steps of fabrication of the NPN bipolar transistor, as described with respect to FIGS. 11a–11k. Doping materials must be selected to account for the different polarities of the various regions of the device. The polarities of the regions are clearly shown in FIGS. 13a–13k. Each of those figures correlates with a similar figure having the same letter designation in FIGS. 11a–11k.

In FIG. 13, there is shown the cross-section of a PNP semiconductor on insulator bipolar transistor 300. In the PNP transistor 300, the p-type emitter region 366 is separated from the p-type collector region 368 by an n-type base region 350. A conductive emitter electrode 386 is directly in contact with the emitter contact region 366. A conductive base electrode 387 is directly in contact with the base region 350. A collector electrode 388 is directly in contact with the collector contact region 368. The halo implants 354 and 356, respectively, completely separate the emitter and collector regions 366 and 368 from the base region 350.

Figure 14:
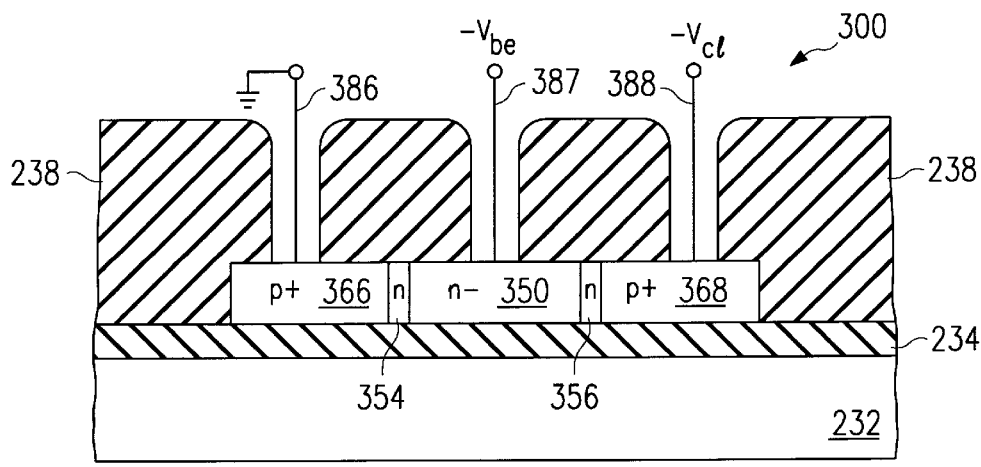
FIG. 14 presents a semiconductor on insulator transistor interconnected with voltage sources for operating the transistor.

As shown in FIG. 14, the semiconductor on insulator PNP transistor 300 is biased for operation similar to other PNP bipolar transistors. For example, the emitter contact region 366 is connected to ground, the base contact region 350 is connected to the base input voltage $-V_{eb}$, and the collector contact region 368 is connected to the collector bias supply voltage $-V_{ce}$.

As the base of bipolar transistor on SOI described in FIG. 11–14 gets shorter and shorter, the emitter/collector will punch through the base region at operation voltage, so that such bipolar transistor on SOI will fail. With halo implant, we can reduce the punch through from emitter and collector and make the very short base bipolar transistors on SOI.

The foregoing describes various semiconductor on insulator transistor devices embodying the invention and the methods of fabricating the same. Those embodiments and methods together with others made obvious in view thereof are considered to be within the scope of the appended claims.

What is claimed is:

1. A transistor, comprising:

an insulating layer;

a semiconductor mesa having a first surface adjacent said insulating layer and a second surface opposite said first surface, said semiconductor mesa comprising:

a first source/drain region within said semiconductor mesa, said first source/drain region of a first conductivity type;

a second source/drain region within said semiconductor mesa, said second source/drain region of said first conductivity type;

a body region in contact with said insulating layer and extending to said second surface of said mesa and located between said first source/drain and second source/drain regions, said body region of a second conductivity type and of a first dopant level;

a first implant region placed between the first source/drain and body regions and completely separating the first source/drain region from the body region, the first implant region being of the second conductivity type and of a dopant level substantially equal to or greater than the first dopant level; and a second implant region placed between the second source/drain and body regions and completely separating the second source/drain region from the body region, the second implant region being of the second conductivity type and of a dopant level substantially equal to or greater than the first dopant level.

2. A transistor device comprising:

an insulating layer;

a semiconductor mesa having a base adjacent said insulating layer, said semiconductor mesa comprising:

a first source/drain region within said semiconductor mesa, said first source/drain region of a first conductivity type and having a dopant level equal to or greater than $10^{20}/cm^3$;

a second source/drain region within said semiconductor mesa, said second source/drain region of the first conductivity type having a dopant level equal to or greater than $10^{20}/cm^3$;

a body region between said first source/drain and second source/drain regions, said body region of a second conductivity type and having a first dopant level in a range between about $10^{14}/cm^3$ and about $10^{18}/cm^3$; and a first implant region placed between the first source/drain region and the body region and completely separating the first source/drain region from the body region, the first implant region being of the second conductivity type and of a dopant level equal to or greater than the first dopant level.

3. The transistor device, in accordance with claim 2, further comprising:

a second implant region placed between the second source/drain region and the body region and completely separating the second source/drain region from the body region, the second implant region being of the second conductivity type and of a dopant level equal to or greater than the first dopant level.

4. The transistor device, in accordance with claim 2, wherein:

a first dopant material for the first implant region is more diffusive than a second dopant material for the source/drain regions.

5. The transistor device, in accordance with claim 2, further comprising:

a gate electrode located near the body region; and a gate insulator separating the gate electrode from the body region.

6. A transistor device, comprising:

a silicon on insulator transistor having first and second source/drain regions and a channel region, the first and second source/drain regions being a first conductivity type, the channel region, positioned between the first and second source/drain regions, being a second conductivity type and doped at a first dopant level;

a first halo junction structure formed between the first source/drain region and the channel region, the first halo junction structure completely separating the first source/drain region from the channel region; and a second halo junction structure formed between the second source/drain region and the channel region, the second halo junction structure completely separating the second source/drain region from the channel region.

* * * * *